US011443661B2

(12) United States Patent
Song et al.

(10) Patent No.: US 11,443,661 B2
(45) Date of Patent: Sep. 13, 2022

(54) FLEXIBLE DISPLAY SUBSTRATE AND METHOD FOR MANUFACTURING THE SAME

(71) Applicants: Chengdu BOE Optoelectronics Technology Co., Ltd., Sichuan (CN); BOE Technology Group Co., Ltd., Beijing (CN)

(72) Inventors: Liang Song, Beijing (CN); Yufei Ji, Beijing (CN); Pengyu Liao, Beijing (CN); Jiahao Xu, Beijing (CN); Hao Cheng, Beijing (CN); Wuyang Zhao, Beijing (CN); Long Jiang, Beijing (CN); Fei Ou, Beijing (CN); Jun Peng, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 75 days.

(21) Appl. No.: 17/255,591

(22) PCT Filed: Apr. 10, 2020

(86) PCT No.: PCT/CN2020/084232
§ 371 (c)(1),
(2) Date: Dec. 23, 2020

(87) PCT Pub. No.: WO2020/238437
PCT Pub. Date: Dec. 3, 2020

(65) Prior Publication Data
US 2021/0272485 A1  Sep. 2, 2021

(30) Foreign Application Priority Data

May 30, 2019 (CN) .......................... 201910465977.3

(51) Int. Cl.
*G09F 9/30* (2006.01)
*H01L 51/00* (2006.01)

(52) U.S. Cl.
CPC .......... *G09F 9/301* (2013.01); *H01L 51/0097* (2013.01)

(58) Field of Classification Search
CPC ...... G06F 1/1641; G06F 1/1652; G09F 9/301; H01L 27/1218; H01L 27/124;
(Continued)

(56) References Cited

U.S. PATENT DOCUMENTS 6,204,168 B1    3/2001  Naik et al.
6,294,315 B2 *  9/2001  Shin .................. H01L 21/76811
                                                        430/394
(Continued)

FOREIGN PATENT DOCUMENTS

CN    107919377 A    4/2018
CN    108493155 A    9/2018
CN    110137186 A    8/2019

OTHER PUBLICATIONS

International Search Report dated Jul. 3, 2020, issued in counterpart application No. PCT/CN2020/084232, with English translation. (5 pages).
Written Opinion dated Jul. 3, 2020, issued in counterpart application No. PCT/CN2020/084232. (5 pages).

*Primary Examiner* — Joe H Cheng
(74) *Attorney, Agent, or Firm* — WHDA, LLP

(57) ABSTRACT

A flexible display substrate and a method for manufacturing the same are provided. The method includes: forming a first insulating layer on a flexible base substrate; forming an etching barrier layer on a side of the first insulating layer away from the flexible base substrate; forming a second insulating layer covering the etching barrier layer on the side of the first insulating layer away from the flexible base
(Continued)

substrate; and forming a first opening in the first insulating layer and a second opening in the second insulating layer through one patterning process, so that an orthographic projection of the first opening on the flexible base substrate falls within an orthographic projection of the second opening on the flexible base substrate, so as to form a step portion at a connection position where the first opening is connected to the second opening.

20 Claims, 21 Drawing Sheets

(58) Field of Classification Search
CPC ............ H01L 27/1248; H01L 27/1262; H01L 51/0097; Y02E 10/549
See application file for complete search history.

(56) References Cited

U.S. PATENT DOCUMENTS

| | | |
|---|---|---|
| 6,767,827 B1 | 7/2004 | Okada et al. |
| 2003/0062627 A1* | 4/2003 | Naik .................... H01L 21/3121 257/773 |
| 2008/0008823 A1 | 1/2008 | Chen et al. |
| 2014/0113438 A1* | 4/2014 | Usami ............... H01L 21/76813 438/488 |
| 2018/0102399 A1 | 4/2018 | Cho et al. |
| 2018/0331166 A1 | 11/2018 | Cho et al. |
| 2019/0341436 A1 | 11/2019 | Cho et al. |
| 2020/0286921 A1* | 9/2020 | Liu ...................... H01L 21/2885 |
| 2020/0328267 A1* | 10/2020 | Li ........................... H01L 51/56 |
| 2020/0365627 A1 | 11/2020 | Zhang et al. |
| 2021/0036077 A1* | 2/2021 | Xu ...................... H01L 27/3258 |
| 2021/0050399 A1 | 2/2021 | Cho et al. |
| 2021/0210718 A1* | 7/2021 | Zhang ................. H01L 27/3258 |

* cited by examiner

FLEXIBLE DISPLAY SUBSTRATE AND METHOD FOR MANUFACTURING THE SAME

CROSS-REFERENCE TO RELATED APPLICATION

This application is the National Stage under 35 U.S.C. § 371(c)(1) of PCT/CN2020/084232 filed on Apr. 10, 2020, which claims the benefit of priority under 35 U.S.C. § 119 of Chinese Application No. 201910465977.3 filed on May 30, 2019, the disclosure of which is incorporated by reference.

TECHNICAL FIELD

The disclosure relates to the field of display technologies, in particular, to a flexible display substrate and a method for manufacturing the flexible display substrate.

BACKGROUND

With the continuous development of technology, full-screen technology is more and more widely used. In order to realize a full screen, a part of the display device needs to be bent, for example, a pad area (bonding pads) on the flexible display substrate is bent. Alternatively, in order to realize flexible display, a part of the display device also needs to be bent. Therefore, a manufacturing process of a bending-resistant connection structure is an issue of concern in this field.

SUMMARY

In an aspect, a method for manufacturing a flexible display substrate is provided, comprising: forming a first insulating layer on a flexible base substrate, the first insulating layer at least covering a bending area of the flexible display substrate; forming an etching barrier layer on a side of the first insulating layer away from the flexible base substrate, the etching barrier layer being located in the bending area; forming a second insulating layer covering the etching barrier layer on the side of the first insulating layer away from the flexible base substrate; and forming a first opening in the first insulating layer and a second opening in the second insulating layer through one patterning process, so that the first opening and the second opening are both located in the bending area, and an orthographic projection of the first opening on the flexible base substrate falls within an orthographic projection of the second opening on the flexible base substrate, so as to form a step portion at a connection position where the first opening is connected to the second opening.

Optionally, forming the first opening in the first insulating layer and the second opening in the second insulating layer through one patterning process comprises: etching the second insulating layer by using an etching gas to form the second opening in the second insulating layer, so that the second opening exposes the etching barrier layer and a part of the first insulating layer; and etching the etching barrier layer and the part of the first insulating layer exposed by the second opening by using the etching gas to form the first opening in the first insulating layer, wherein an etching rate of the etching gas to the etching barrier layer is lower than an etching rate of the etching gas to the first insulating layer.

Optionally, the etching rate of the etching gas to the etching barrier layer is substantially zero.

Optionally, etching the etching barrier layer and the part of the first insulating layer exposed by the second opening by using the etching gas to form the first opening in the first insulating layer specifically comprises: etching the part of the first insulating layer, that is exposed by the second opening and not covered by the etching barrier layer, by using the etching gas; etching the etching barrier layer by using the etching gas; and etching a part of the first insulating layer, that is covered by the etching barrier layer, by using the etching gas.

Optionally, etching the etching barrier layer and the part of the first insulating layer exposed by the second opening by using the etching gas to form the first opening in the first insulating layer specifically comprises: etching the part of the first insulating layer, that is exposed by the second opening and not covered by the etching barrier layer, by using the etching gas; etching the etching barrier layer by using the etching gas; and keeping a part of the first insulating layer covered by the etching barrier layer.

Optionally, etching the etching barrier layer and the part of the first insulating layer exposed by the second opening by using the etching gas to form the first opening in the first insulating layer specifically comprises: etching the part of the first insulating layer, that is exposed by the second opening and not covered by the etching barrier layer, by using the etching gas; and keeping the etching barrier layer and a part of the first insulating layer covered by the etching barrier layer.

Optionally, forming the etching barrier layer on the side of the first insulating layer away from the flexible base substrate specifically comprises: forming at least two etch barrier lines, which are spaced apart from one another, on the side of the first insulating layer away from the flexible base substrate.

Optionally, forming the etching barrier layer on the side of the first insulating layer away from the flexible base substrate specifically comprises: forming a plurality of island-shaped etching barrier portions, which are spaced apart from one another, on the side of the first insulating layer away from the flexible base substrate.

Optionally, forming the etching barrier layer on the side of the first insulating layer away from the flexible base substrate specifically comprises: forming a gate electrode material layer on the side of the first insulating layer away from the flexible base substrate; and performing one patterning process on the gate electrode material layer to form a gate electrode of a thin film transistor and the etching barrier layer.

Optionally, the etching gas comprises sulfur hexafluoride and oxygen.

Optionally, the etching gas comprises carbon tetrafluoride and oxygen.

Optionally, the method further comprises: forming a conductive wiring in both the first opening and the second opening.

Optionally, a plurality of via holes are formed in both the first insulating layer and the second insulating layer while forming the first opening in the first insulating layer and the second opening in the second insulating layer through one patterning process.

Optionally, forming the conductive wiring in both the first opening and the second opening specifically comprises: depositing a conductive material layer on a surface of the second insulating layer away from the flexible base substrate, in the plurality of via holes, in the first opening and in the second opening, respectively; and forming a source electrode and a drain electrode of a thin film transistor as well as the conductive wiring through one patterning process.

Optionally, the first insulating layer comprises a barrier layer and a buffer layer; and/or, the second insulating layer comprises a gate insulating layer, a first interlayer insulating layer and a second interlayer insulating layer.

In another aspect, a flexible display substrate is provided, comprising: a flexible base substrate; a first insulating layer on the flexible base substrate, wherein the first insulating layer covers at least a bending area of the flexible display substrate, and the first insulating layer is provided with a first opening; an etching barrier layer on a side of the first insulating layer away from the flexible base substrate; and a second insulating layer on the side of the first insulating layer away from the flexible base substrate, wherein the second insulating layer is provided with a second opening, wherein an orthographic projection of the first opening on the flexible base substrate falls within an orthographic projection of the second opening on the flexible base substrate, the flexible display substrate further comprises a step portion at a connection position where the first opening is connected to the second opening, the etching barrier layer is located at the step portion, and the first opening, the second opening and the step portion are all located in the bending area.

Optionally, the etching barrier layer comprises a plurality of island-shaped etching barrier portions that are spaced apart from one another.

Optionally, the flexible display substrate further comprises a thin film transistor on the flexible base substrate, the thin film transistor comprising a gate electrode, a source electrode and a drain electrode, wherein the gate electrode and the etching barrier layer are located in the same layer.

Optionally, the flexible display substrate further comprises a plurality of conductive wirings located on a sidewall of the second opening, on the step portion, and on a sidewall and a bottom surface of the first opening, and each of the conductive wirings extends from a display area of the flexible display substrate to a non-display area of the flexible display substrate.

Optionally, each of the island-shaped etching barrier portions has a first size in a direction parallel to a surface of the flexible base substrate and perpendicular to an extension direction of the conductive wirings, each of the conductive wirings has a second size in the direction parallel to the surface of the flexible base substrate and perpendicular to the extension direction of the conductive wirings, and the first size is substantially equal to the second size.

BRIEF DESCRIPTION OF THE DRAWINGS

Through the following description of the present disclosure with reference to accompanying drawings, other purposes and advantages of the present disclosure will become apparent, and it may help to have a comprehensive understanding of the present disclosure.

Figure 1:
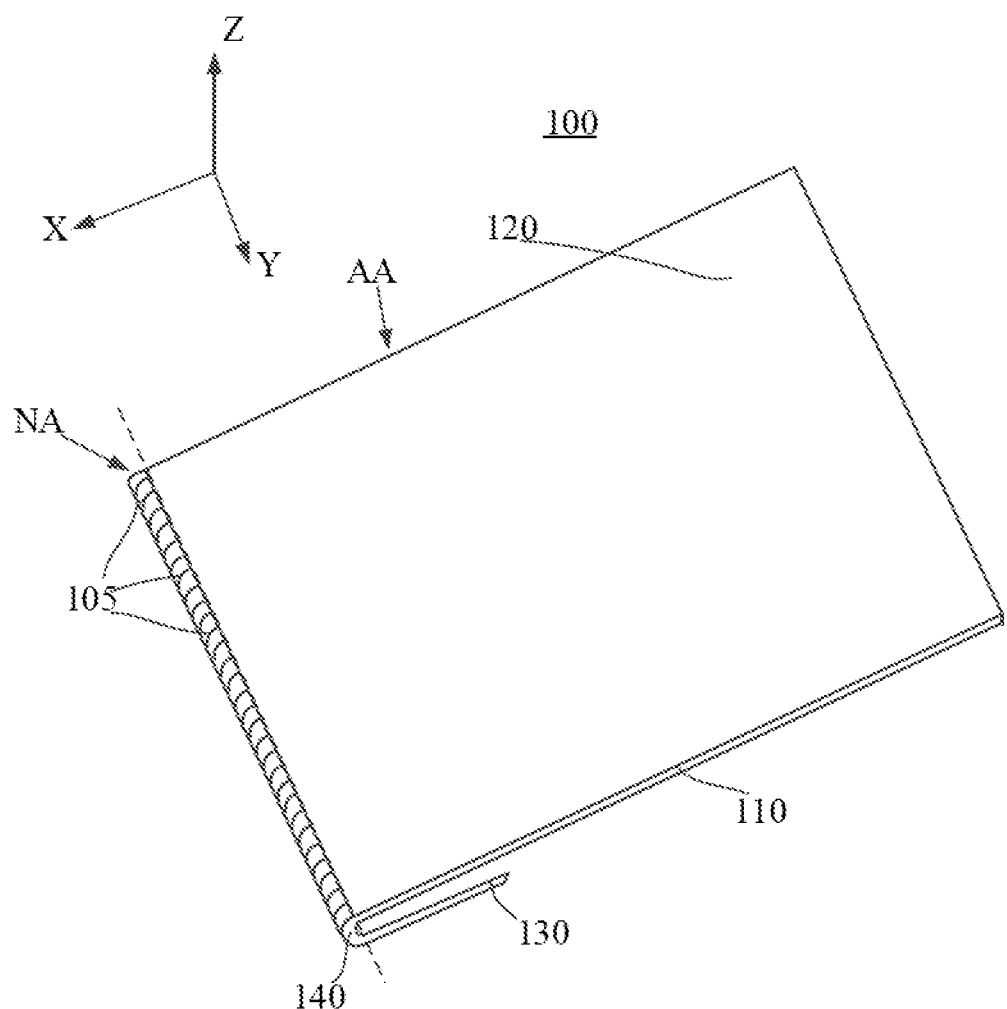
FIG. 1 is a schematic diagram of a flexible display substrate in a folded state according to some embodiments of the present disclosure.

It should be noted that, in the drawings used to describe the embodiments of the present disclosure, sizes of layers, structures, or regions may be enlarged or reduced, that is, these drawings are not drawn according to actual scale, in order to make the drawings be clear.

DETAILED DESCRIPTION OF EMBODIMENTS

In order to make objectives, technical solutions, and advantages of the embodiments of the present disclosure clear, the technical solutions of the embodiments of the present disclosure will be described clearly and completely in conjunction with the accompanying drawings of the embodiments of the present disclosure. Obviously, the described embodiments are a part of the embodiments of the present disclosure, rather than all of the embodiments. Based on the described embodiments of the present disclosure, all other embodiments obtained by those of ordinary skill in the art without creative labor shall fall within the protection scope of the present disclosure.

Unless otherwise defined, the technical or scientific terms used in the present disclosure shall have the usual meanings understood by those of ordinary skill in the art. Terms such as "first", "second" and similar words used in the present disclosure do not indicate any order, quantity, or importance, but are only used to distinguish different components. Words such as "comprise" or "include" or other similar words mean that elements or items appearing before the words contain elements or items listed after the words and their equivalents, but do not exclude other elements or items. Terms such as "up", "down", "left", "right", and the like are only used to indicate the relative position relationship. When the absolute position of the described object changes, the relative position relationship may also change accordingly.

Herein, unless otherwise specified, an expression "A and B are located in the same layer" means that A and B are made of the same material and formed through the same one patterning process. For example, it may include the case where A and B are located at different height positions of the flexible base substrate.

Herein, an expression "patterning process" generally includes steps of photoresist coating, exposure, development, etching, and photoresist stripping. An expression "one patterning process" means a process of forming patterned layers, parts, components, and the like, by using one mask.

Figure 2:
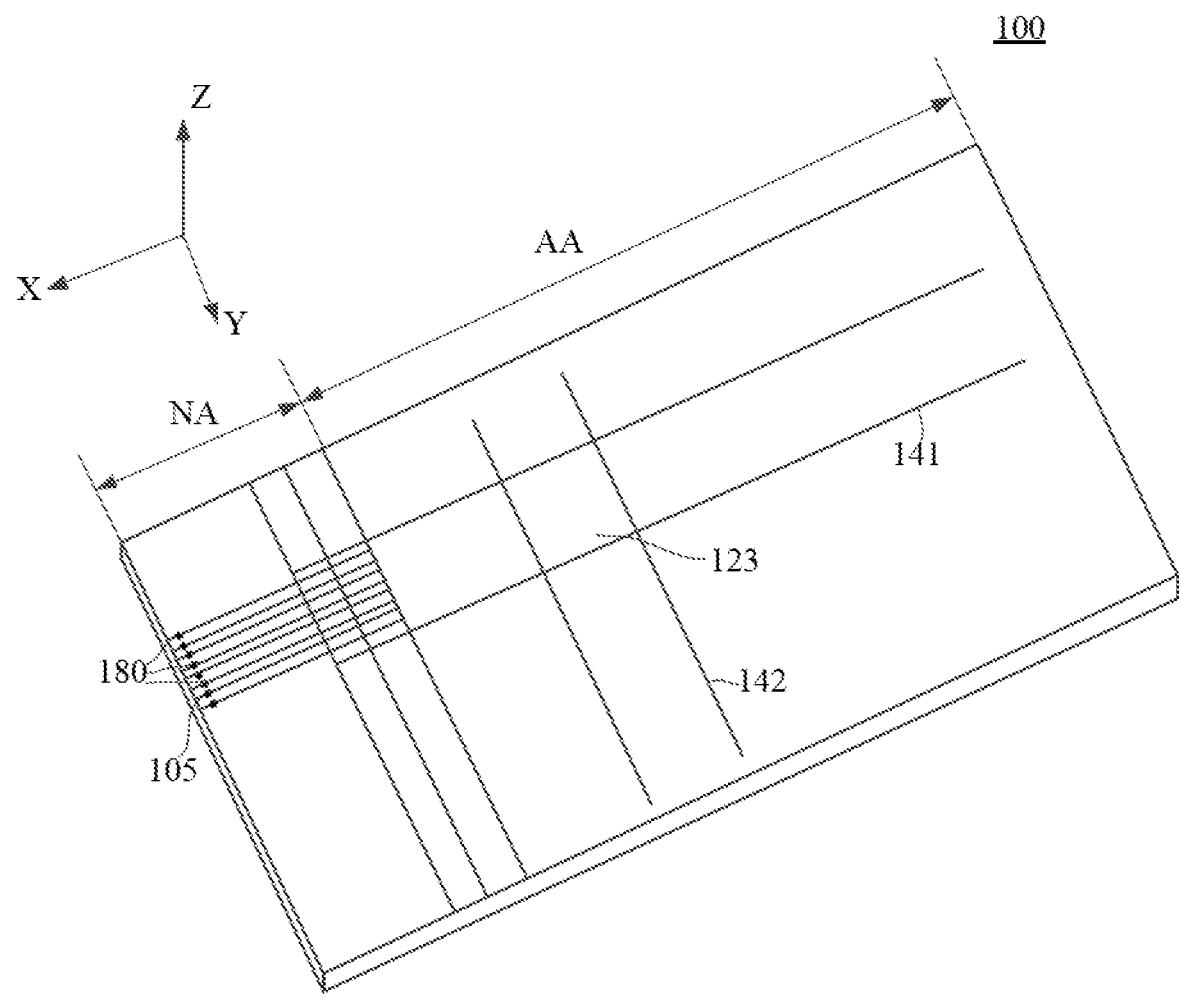
FIG. 2 is a schematic diagram of a flexible display substrate in an unfolded state according to some embodiments of the present disclosure.
Figure 3:
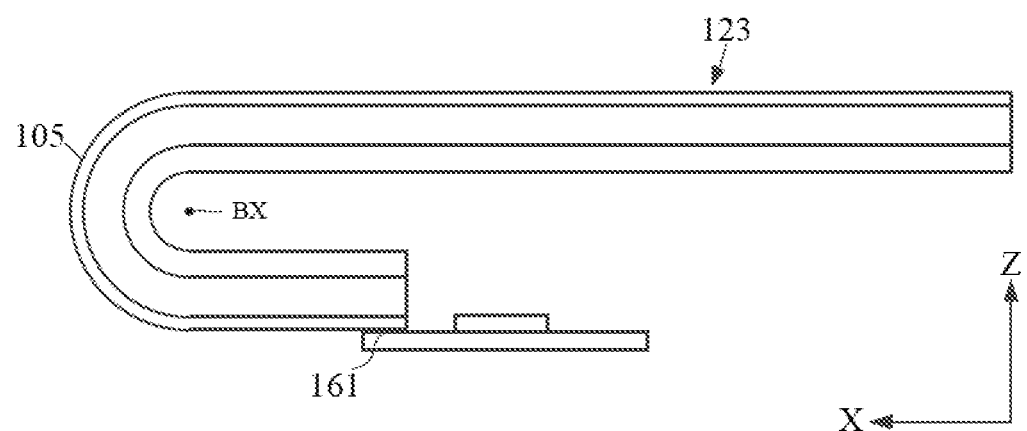
FIG. 3 is a schematic cross-sectional view of a flexible display substrate according to some embodiments of the present disclosure in X direction.

FIG. 1 is a schematic diagram of a flexible display substrate in a folded state according to some exemplary embodiments of the present disclosure, FIG. 2 is a schematic diagram of the flexible display substrate in FIG. 1 in an unfolded state, and FIG. 3 shows a schematic cross-sectional view of the flexible display substrate in FIG. 1 in the X direction. Referring to FIGS. 1, 2 and 3 together, the flexible display substrate 100 includes a display area AA, a pad area 130, and a bending area 140 between the display area and the pad area 130. Both the pad area 130 and the bending area 140 are located in a non-display area NA outside the display area. The flexible display substrate 100 may include a flexible base substrate 110, and a display unit 120 and bonding pads 180 located on the flexible base substrate 110.

For example, the flexible display substrate 100 may be an array substrate of a full-screen phone. The flexible base substrate 110 may be an organic flexible base substrate formed of, for example, polyimide (PI), polyethylene terephthalate (PET), polycarbonate, polyethylene, polyacrylate, polyetherimide, polyethersulfone and the like.

The display unit 120 is disposed in the display area AA. The display unit 120 includes a plurality of data lines 141 extending in the X direction and a plurality of gate lines 142 extending in the Y direction. The plurality of gate lines and the plurality of data lines cross each other to define a plurality of pixel areas, and each pixel area is provided with a pixel unit 123. For clarity, only a few gate lines and a few data lines are schematically drawn in FIG. 2. The embodiments of the present disclosure will describe the specific structure of the pixel unit 123 in detail below.

As shown in FIGS. 3 and 1, the bending area 140 in FIG. 1 may be bent around a bending axis BX. It should be noted that, in this context, the expression "bending axis" refers to a virtual axis, around which the bending area 140 is bendable, instead of referring to a physical bending axis provided in the flexible display substrate.

For example, in order to facilitate wiring, the bending area 140 is disposed on a non-display area side of the flexible display substrate in the X direction, that is, on a side in an extension direction of the data line 141, and the bending axis is parallel to the Y direction. In this way, a gate drive circuit may be bonded on the non-display area side of the flexible display substrate in the Y direction, or a GOA circuit (Gate driver On Array) may be directly formed on the flexible base substrate. A wiring 105 is provided in the bending area 140 for electrically connecting the driving circuit to the pixel unit 123 so as to transmit signals output by the driving circuit to various pixel units 123. Specifically, as shown in FIG. 1, the pad area 130 is disposed on a side of the bending area 140 away from the display area, that is, an edge of the flexible display substrate in the X direction. As shown in FIGS. 2 and 3, the bonding pads 180 are arranged in the pad area 130 and configured to bond with output wiring part 161 of the driving circuit. Various signals (for example, display data signals, power voltage signals such as VDD, VSS) output by the driving circuit are output to the bonding pads 180, and then transmitted to the display area through the wiring 105 to realize image display. For example, the bonding pads 180 are electrically connected with the data line 141 through the wiring 105 to supply display data signals to the data line 141, or the bonding pads 180 are electrically connected with the VDD or VSS power terminal through the wiring 105 to supply the pixel unit 123 with VDD or VSS voltage. That is, in the embodiments of the present disclosure, the wiring 105 may include various conductive wirings, for example data lines, VSS power lines, and VDD power lines, that extend from the display area AA to the non-display area NA and are configured to transmit electrical signals.

In the embodiments of the present disclosure, by providing the bending area, the pad area 130 is bendable to the back of the display area and overlap with the display area, thereby reducing external space of the display unit 120 and achieving a narrow frame or even frameless display device.

Figure 4:
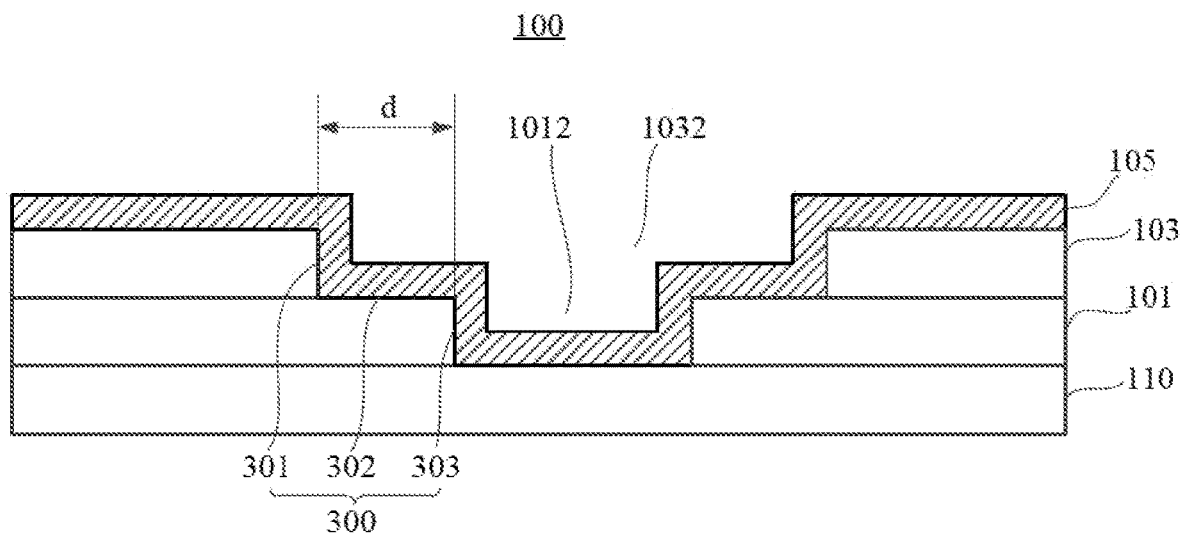
FIG. 4 is an enlarged cross-sectional view of a bending area of a flexible display substrate according to some exemplary embodiments of the present disclosure.

The inventor has found through research that inorganic insulating materials are generally less flexible and easily broken under external force, so that conductive properties of conductive materials attached onto the inorganic insulating materials may be adversely affected. Therefore, it is necessary to remove the inorganic insulating materials in the bending area to form an opening, and to form a step structure at the opening, so that conductive wirings are formed on the step structure, so as to prevent the formed conductive material from having a large segment difference and being easily broken. For example, FIG. 4 is an enlarged cross-sectional view of a bending area of a flexible display substrate according to some embodiments of the present disclosure. As shown in FIG. 4, the flexible display substrate 100 may include a flexible base substrate 110, a first insulating layer 101 and a second insulating layer 103 both disposed on the flexible base substrate 110. The first insulating layer 101 and the second insulating layer 103 located in the bending area 140 are partially removed, a first opening 1012 is formed in the first insulating layer 101, and a second opening 1032 is formed in the second insulating layer 103, and the size of the second opening 1032 is larger than the size of the first opening 1012, that is, the second opening 1032 exposes the first opening 1012, thereby forming the step structure 300 as shown in FIG. 4. For example, the step structure 300 may include a step portion 302, a first extension portion 301 located on a side of the step portion 302 away from the flexible base substrate and connected to a first side of the step portion 302, and a second extension portion 303 on a side of the step portion 302 close to the flexible base substrate and connected to a second side of the step portion 302. Optionally, in the illustrated embodiment, the step portion 302 extends in a substantially horizontal direction, the first extension portion 301 and the second extension portion 303 extend substantially in parallel, and the extension direction thereof is substantially parallel to the vertical direction. The step portion 302 has a width d. The wiring 105 is formed on the first insulating layer 101 and the second insulating layer 103. For example, the wiring 105 may include various wirings that electrically connect the pixel unit 123 in the display area to the pad area 130, and the wiring 105 may be formed on a surface of the second insulating layer 103 away from the flexible base substrate 110, a sidewall of the second opening 1032, a sidewall of the first opening 1012, and a bottom surface of the first opening 1012. By providing the step structure, the segment difference of the wiring 105 formed on the insulating layers may not be too large, so that the wiring 105 may be prevented from breaking, and in particular, the wiring 105 may be effectively prevented from breaking when it is bent.

It should be noted that the first insulating layer and the second insulating layer shown in FIG. 4 are only schematic, and each of the first insulating layer and the second insulating layer may include a single insulating layer or multiple insulating layers.

Figure 5A:
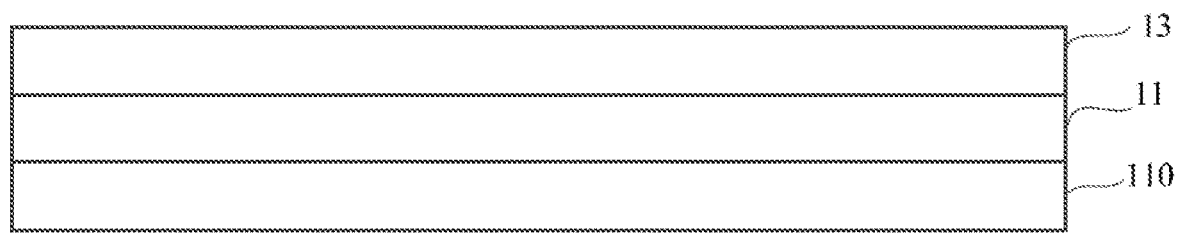
FIGS. 5A-5D schematically show schematic diagrams of steps of a method for manufacturing a flexible display substrate according to some embodiments of the present disclosure.

FIGS. 5A-5D schematically show schematic diagrams of steps of a method for manufacturing a flexible display substrate according to some embodiments of the present disclosure. Referring to FIG. 5A, a first insulating material layer 11 and a second insulating material layer 13 are sequentially formed on the flexible base substrate 110.

Figure 5B:
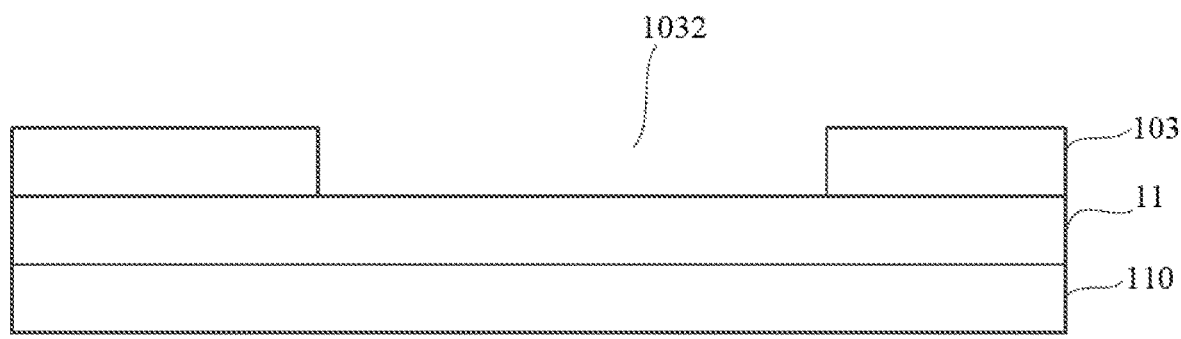

Referring to FIG. 5B, a second opening 1032 is formed in the second insulating material layer 13 using a first patterning process, and the second opening 1032 exposes the first insulating material layer 11, thereby forming the second insulating layer 103 having the second opening 1032.

Figure 5C:
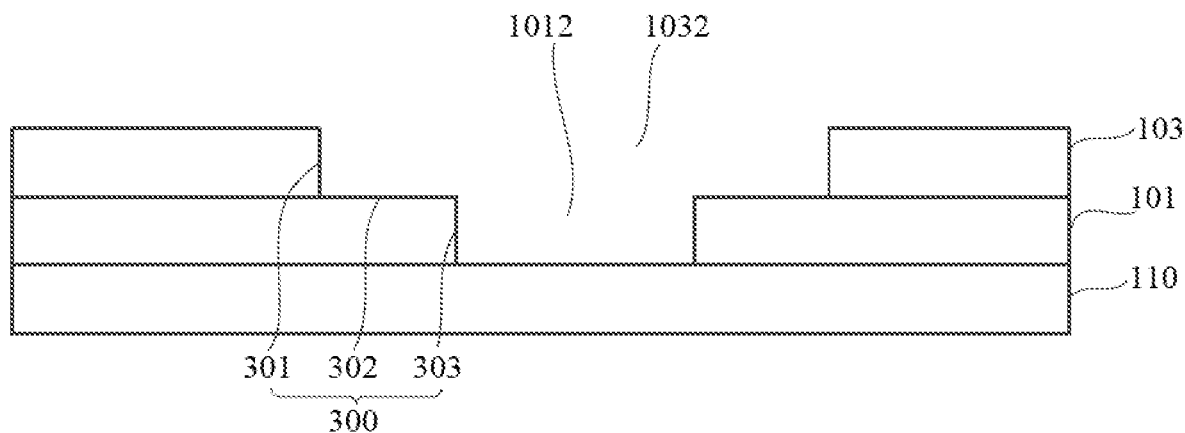
Figure 5D:
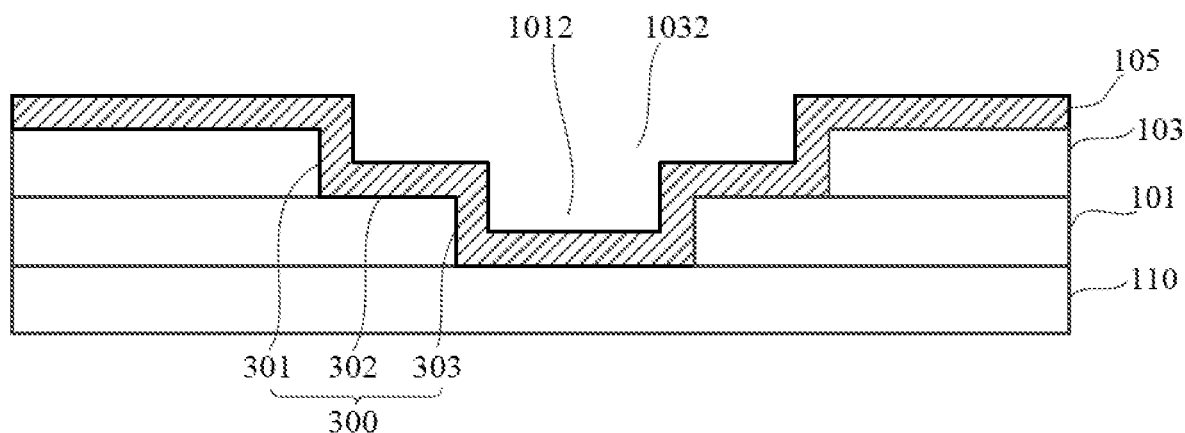

Referring to FIG. 5C, a first opening 1012 is formed in the first insulating material layer 11 using a second patterning process, the size of the first opening 1012 is smaller than the second opening 1032, that is, an orthographic projection of the first opening 1012 on the flexible base substrate 110 falls within an orthographic projection of the second opening 1032 on the flexible base substrate 110, thereby forming the step structure 300 as shown in FIGS. 4 and 5C.

Referring to 5D, a wiring 105 is formed on surfaces of the first insulating layer 101 and the second insulating layer 103 away from the flexible base substrate 110. For example, the wiring 105 may be formed on a surface of the second insulating layer 103 away from the flexible base substrate 110, a side wall of the second opening 1032, a side wall of the first opening 1012, and a bottom surface of the first opening 1012.

In this embodiment, it is necessary to form the second insulating layer 103 with the second opening 1032 and the first insulating layer 101 with the first opening 1012 through two patterning processes, and two mask plates are required. The manufacturing process is more complicated, the manufacturing cost is high, and it is difficult to increase the production capacity of the flexible display substrate.

Figure 6:
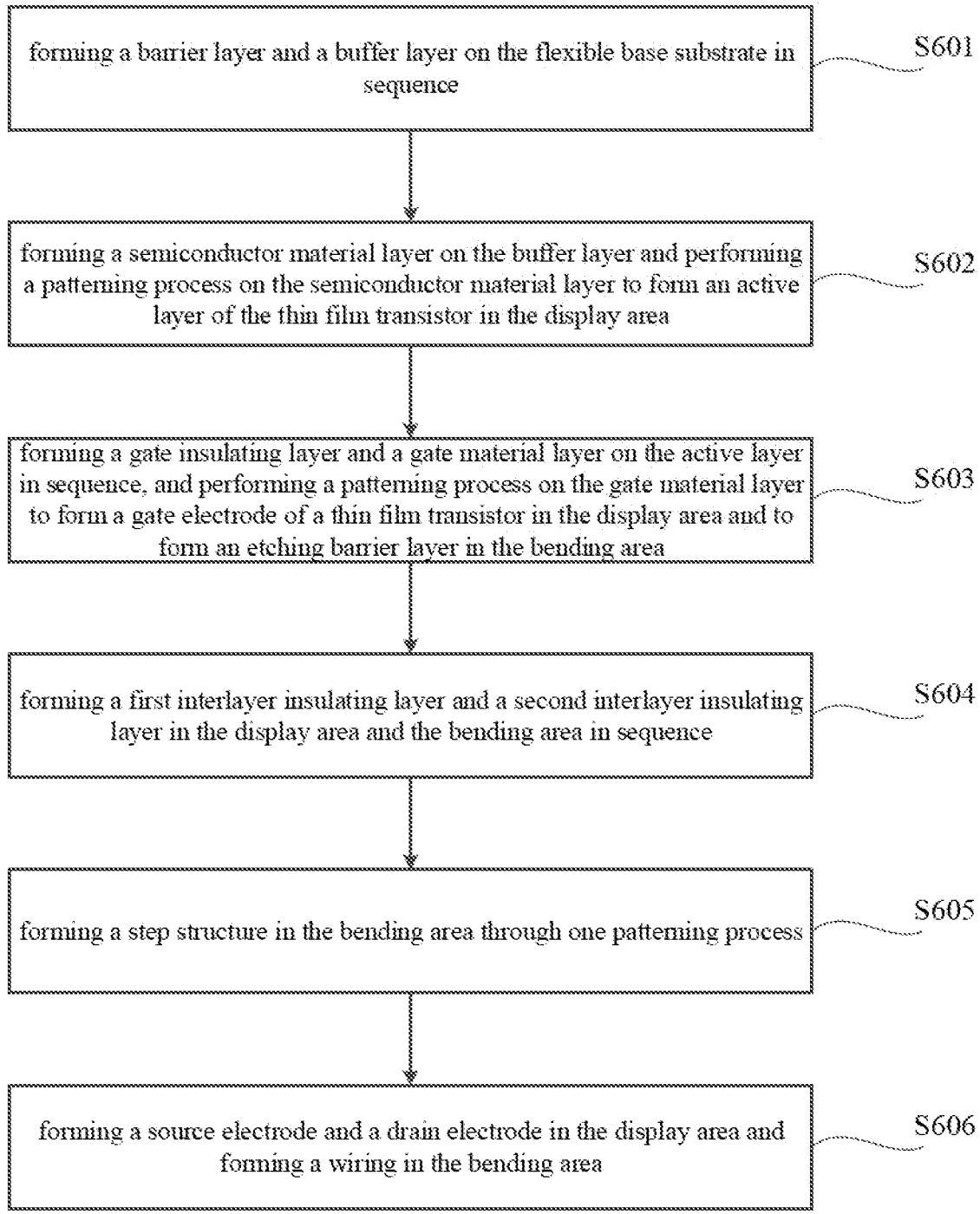
FIG. 6 is a flowchart of a method for manufacturing a flexible display substrate according to some embodiments of the present disclosure.

FIG. 6 is a flowchart of a method for manufacturing a flexible display substrate according to some embodiments of the present disclosure, and FIGS. 7A-7E schematically show schematic diagrams of steps of a method for manufacturing a flexible display substrate according to some embodiments of the present disclosure. Please refer to FIG. 6 and FIGS. 7A-7E together. The manufacturing method may include the following steps S601-S606.

Figure 7A:
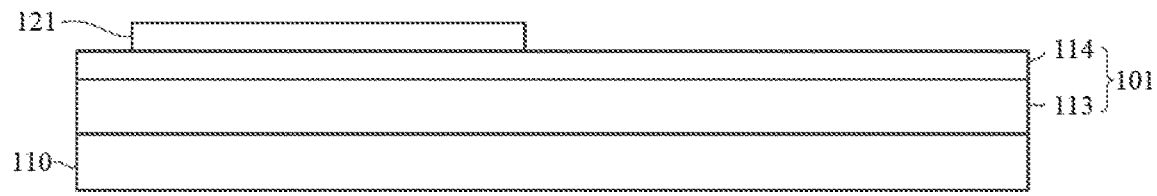
FIGS. 7A-7E schematically show schematic diagrams of steps of a method for manufacturing a flexible display substrate according to some embodiments of the present disclosure.

In step S601, as shown in FIG. 7A, a barrier layer 113 and a buffer layer 114 may be sequentially formed on the flexible base substrate 110.

For example, the flexible base substrate 110 may be an organic flexible base substrate, for example, including polyimide (PI), polyethylene terephthalate (PET), polycarbonate, polyethylene, polyacrylate, polyetherimide, polyethersulfone, etc.

For example, any one of the barrier layer 113 and the buffer layer 114 may include an inorganic insulating material, for example, silicon oxide, silicon nitride, silicon oxynitride, etc., or an insulating material including metallic elements such as aluminum oxide, titanium nitride and so on.

For example, the barrier layer 113 and the buffer layer 114 may be formed by a process such as chemical vapor deposition process.

It should be noted that the first insulating layer 101 may include the barrier layer 113 and the buffer layer 114. However, the embodiments of the present disclosure are not limited thereto. In other embodiments, the first insulating layer 101 may also include other insulating layers.

In step S602, as shown in FIG. 7A, a semiconductor material layer is formed on the buffer layer 114, and a patterning process is performed on the semiconductor material layer to form an active layer 121 of the thin film transistor in the display area.

For example, the semiconductor material layer may include an elementary substance semiconductor material or a compound semiconductor material, for example, may include amorphous silicon, polysilicon (low temperature polysilicon or high temperature polysilicon), metal oxide semiconductor (such as IGZO, AZO), and the like.

For example, the patterning process may use a conventional photolithography process, including steps of photoresist coating, exposure, development, etching, and photoresist stripping, which will not be repeated here.

Figure 7B:
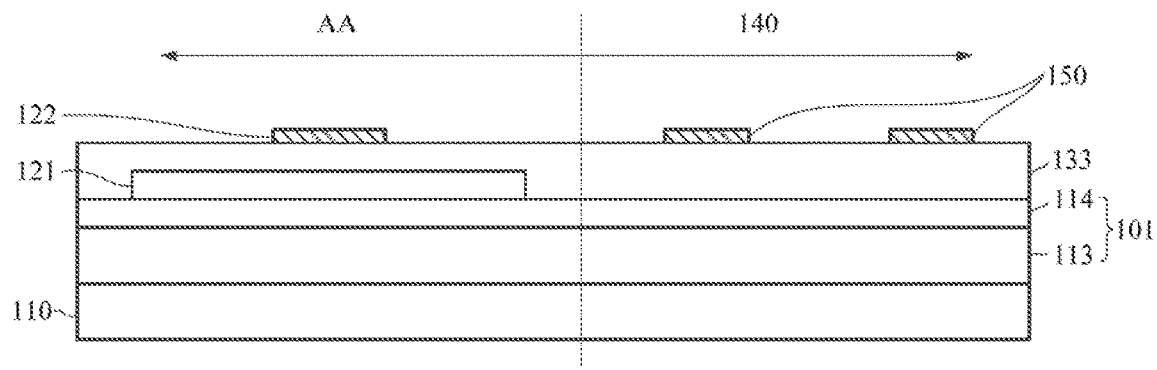
Figure 7C:
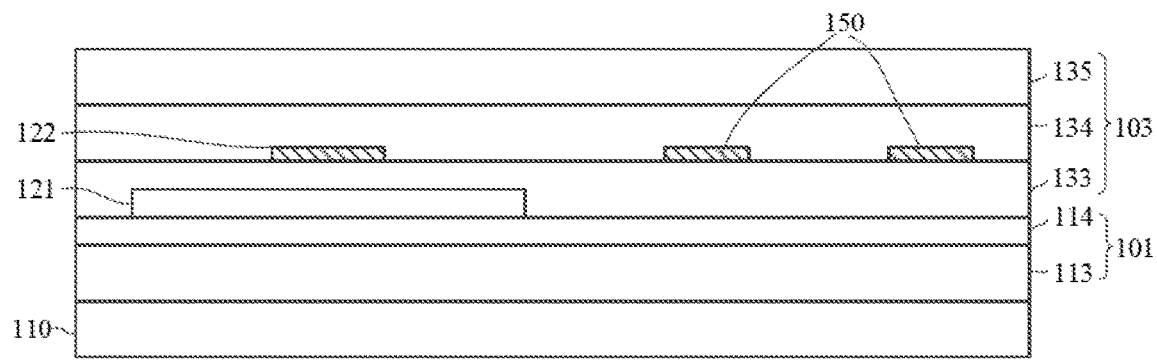

In step S603, as shown in FIG. 7B, a gate insulating layer 133 and a gate electrode material layer may be sequentially formed on the active layer 121, and a patterning process may be performed on the gate electrode material layer to form a gate electrode 122 of the thin film transistor in the display area AA and to form an etching barrier layer 150 in the bending area 140.

For example, the gate insulating layer 133 may be a single-layer structure of silicon nitride or silicon oxide, or a multilayer structure formed by stacking silicon nitride and silicon oxide.

For example, the gate electrode material layer may include gold (Au), silver (Ag), copper (Cu), aluminum (Al), molybdenum (Mo), magnesium (Mg), tungsten (W) and alloy materials formed by combining the above metals, or conductive metal oxide materials, such as indium tin oxide (ITO), indium zinc oxide (IZO), zinc oxide (ZnO), zinc aluminum oxide (AZO), etc.

Figure 8:
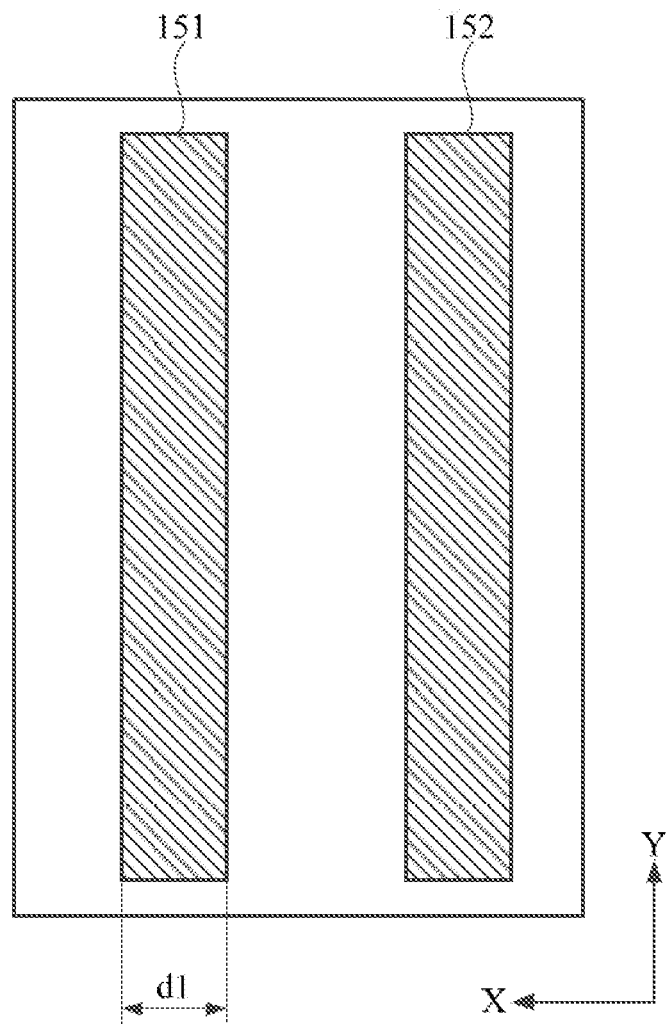
FIG. 8 shows a schematic plan view of an etching barrier layer in a bending area of a flexible display substrate according to some exemplary embodiments of the present disclosure.

FIG. 8 shows a schematic plan view of a bending area with an etching barrier layer. As shown in FIG. 8, the etching barrier layer 150 includes two etching barrier lines 151 and 152. The two etching barrier lines 151 and 152 and the gate electrode 122 of the thin film transistor are formed of the same material and through the same patterning process. In other words, the material of the two etching barrier lines 151, 152 may also include gold (Au), silver (Ag), copper (Cu), aluminum (Al), molybdenum (Mo), magnesium (Mg), and tungsten (W) and alloy materials formed by combining the above metals, or conductive metal oxide materials, such as indium tin oxide (ITO), indium zinc oxide (IZO), zinc oxide (ZnO), zinc aluminum oxide (AZO), etc.

With reference to FIGS. 4, 7B and 8 in combination, the etching barrier layer 150 is formed at a position, where the step portion is to be formed, in the bending area 140. For example, the width (that is, the width d1 in the X direction in FIG. 8) of each of the two etching barrier lines 151 and 152 is substantially equal to the width (that is, the width d in FIG. 4) of the step portion to be formed. Here, an expression "substantially equal" includes a difference between the width of each of the two etching barrier lines 151, 152 and the width of the step portion to be formed is less than or equal to ±5 μm, that is, when the difference between the width of each of the two etching barrier lines 151, 152 and the width of the step portion to be formed is less than or equal to ±5 μm, it may be considered that they are substantially equal to each other. For example, the width of the step portion 302 may be about 15 μm, and the width d1 of each etching barrier line may be in the range of 10 μm-20 μm, optionally, the width d1 of each etching barrier line may be equal to 15 μm.

Specifically, step S603 may be further described with reference to FIGS. 9A-9D.

Figure 9A:
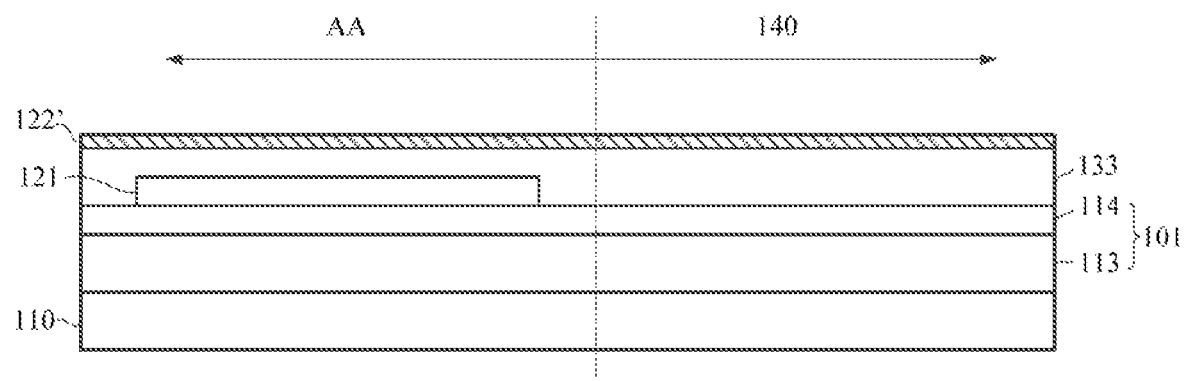
FIGS. 9A-9D schematically show schematic diagrams of steps of forming an etching barrier layer in a method for manufacturing a flexible display substrate according to some embodiments of the present disclosure.

As shown in FIG. 9A, for example, the gate insulating layer 133 may be formed in both the display area AA and the bending area 140 by chemical vapor deposition, and the gate electrode material layer 122' is formed on the gate insulating layer 133 in both the display area AA and the bending area 140 by processes such as sputtering, physical vapor deposition, and chemical vapor deposition.

Figure 9B:
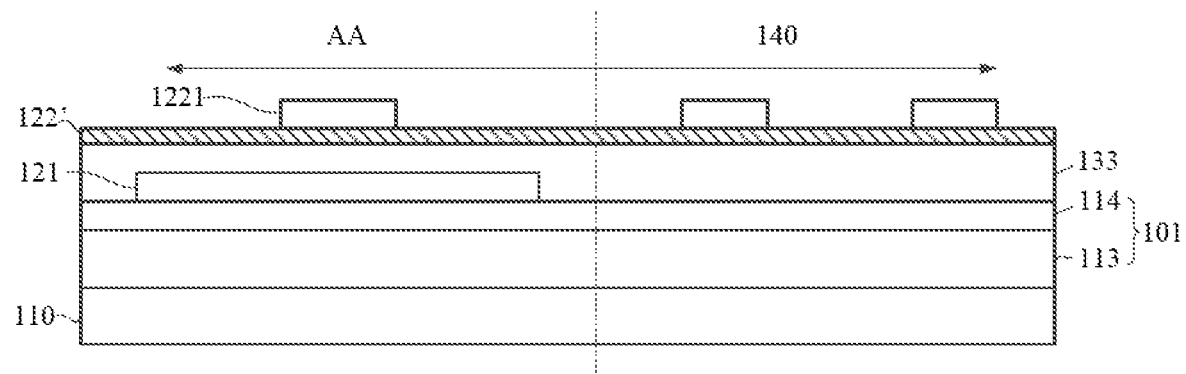

As shown in FIG. 9B, a photoresist may be coated on the gate electrode material layer 122', and the photoresist may be exposed and developed to form a photoresist pattern 1221. The photoresist pattern 1221 corresponds to positions of the gate electrode 122 and the etching barrier layer 150 to be formed, that is, an orthographic projection of the photoresist pattern 1221 on the flexible base substrate 110 covers orthographic projections of the gate electrode 122 and the etching barrier layer 150 to be formed on the flexible base substrate 110.

Figure 9C:
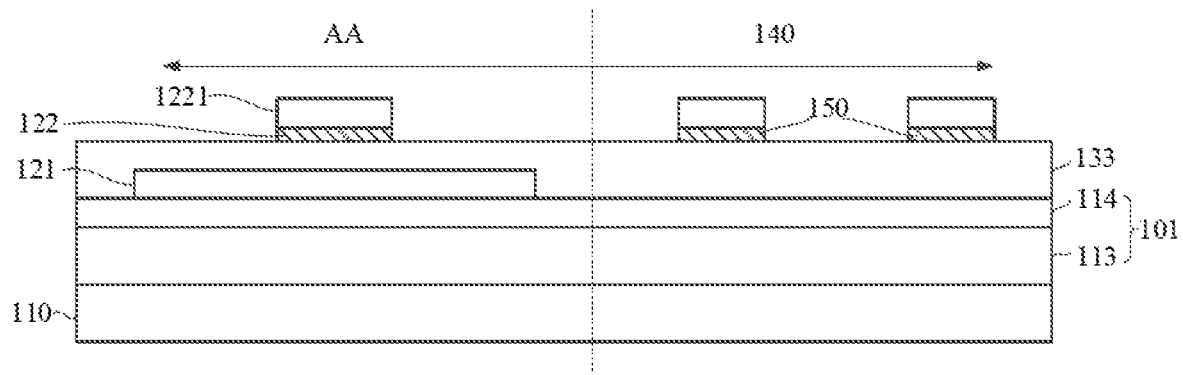

As shown in FIG. 9C, for example, a part of the gate electrode material layer 122' that is not covered by the photoresist pattern 1221 may be etched by a wet etching process to form the gate electrode 122 and the etching barrier layer 150.

Figure 9D:
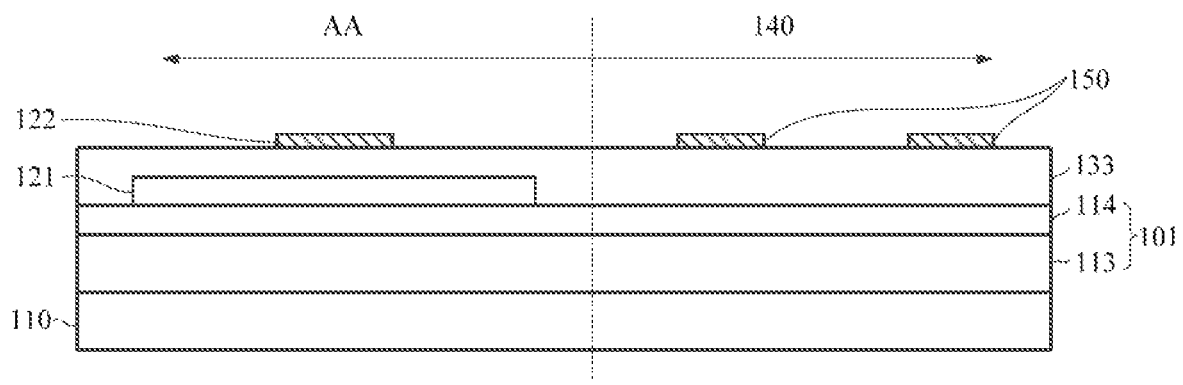

As shown in FIG. 9D, the photoresist pattern 1221 is peeled off. In this way, the gate electrode 122 of the thin film transistor is formed in the display area AA, and the etching barrier layer 150 is formed in the bending area 140.

It should be noted that, in step S603, in addition to forming the gate electrode 122 and the etching barrier layer 150, the gate line 142 may also be formed by the same patterning process, which will not be repeated here.

In step S604, referring back to FIG. 7C, a first interlayer insulating layer 134 and a second interlayer insulating layer 135 are sequentially formed in both the display area AA and the bending area 140.

For example, the first interlayer insulating layer 134 and the second interlayer insulating layer 135 may include an inorganic insulating material, for example, silicon oxide, silicon nitride, silicon oxynitride, etc., or an insulating material including metallic elements such as aluminum oxide, titanium nitride and so on.

For example, the first interlayer insulating layer 134 and the second interlayer insulating layer 135 may be formed by using a chemical vapor deposition process or the like.

It should be noted that the second insulating layer 103 may include the gate insulating layer 133, the first interlayer insulating layer 134, and the second interlayer insulating layer 135. However, the embodiments of the present disclosure are not limited thereto, and in other embodiments, the second insulating layer 103 may also include other insulating layers.

Figure 7D:
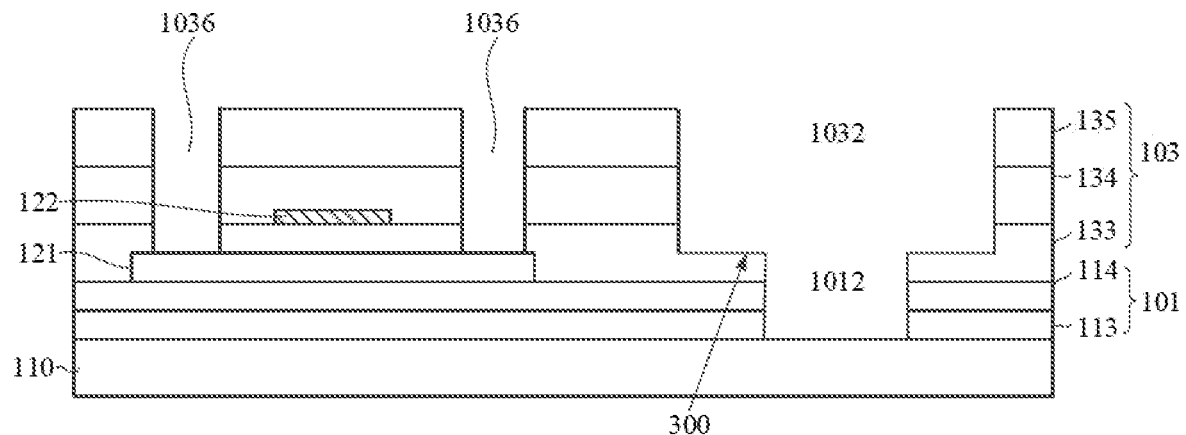

In step S605, as shown in FIG. 7D, a step structure 300 is formed in the bending area 140 through one patterning process. For example, through one patterning process, the first opening 1012 is formed in the first insulating layer 101 (for example, including the barrier layer 113 and the buffer layer 114) and the second opening 1032 is formed in the second insulating layer 103 (for example, including the gate insulating layer 133, the first interlayer insulating layer 134 and the second interlayer insulating layer 135).

Specifically, step S605 may be further described with reference to FIGS. 10A-10D.

Figure 10A:
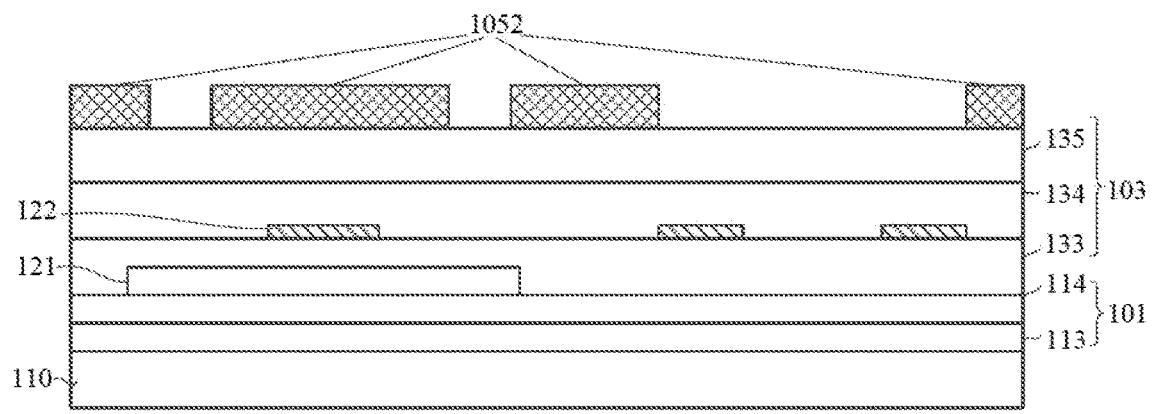
FIGS. 10A-OD schematically show schematic diagrams of steps of forming a step structure in a method for manufacturing a flexible display substrate according to some embodiments of the present disclosure.

As shown in FIG. 10A, a photoresist may be coated on the second interlayer insulating layer 135, and the photoresist may be exposed and developed to form a photoresist pattern 1052. For example, the photoresist pattern 1052 may expose the insulating layers located in the bending area 140.

Figure 10B:
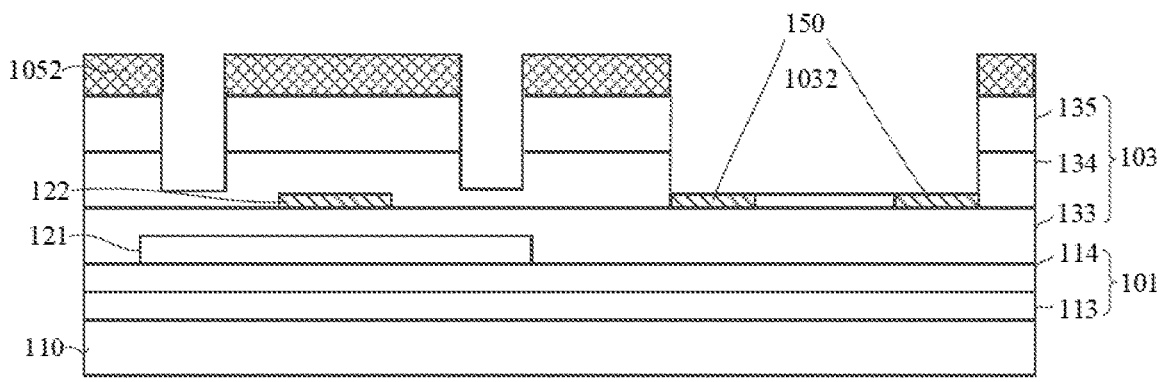
Figure 10C:
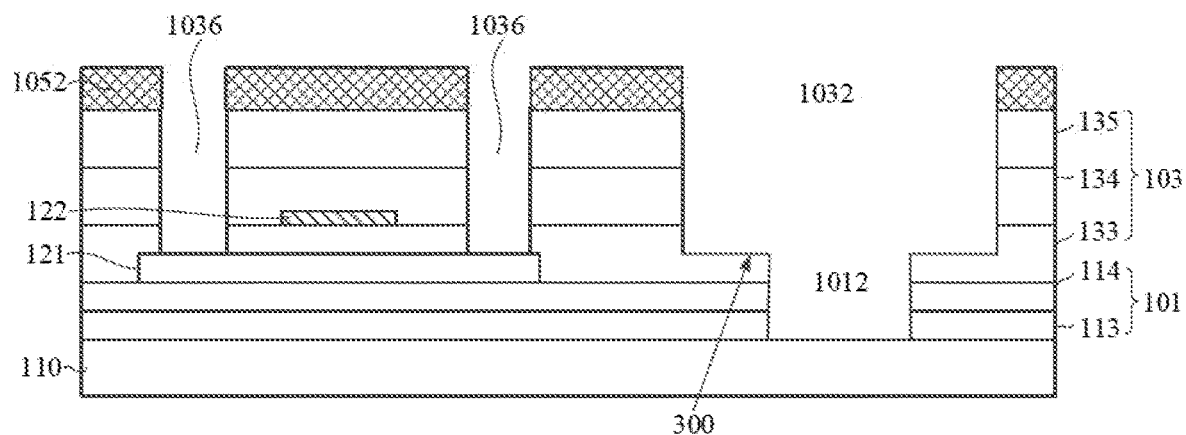

As shown in FIGS. 10B and 10C, the insulating layers that are not covered by the photoresist pattern 1052 may be etched by a dry etching process. For example, the first insulating layer 101 and the second insulating layer 103 may be etched by using a plasma etching gas containing "$SF_6$ and $O_2$". The etching barrier layer 150 is formed in the bending area 140, and the etching barrier layer 150 is formed of a metal material such as molybdenum or the like. For example, an etching rate of the etching gas containing "$SF_6$ and $O_2$" to the etching barrier layer 150 is relatively slow. In other words, the etching rate of the etching gas to the metal material (the material forming the etching barrier layer 150) is lower than an etching rate of the etching gas to the insulating material (the material forming the first insulating layer 101 or the second insulating layer 103). Therefore, in the process of etching the first insulating layer 101 and the second insulating layer 103, the etching gas may first etch the second insulating layer 103 to form a second opening 1032 in the second insulating layer 103, as shown in FIG. 10B. Then, the etching gas further etches the first insulating layer 101 downward. For the first insulating layer 101 covered by the etching barrier layer 150, the etching gas needs to firstly etch the etching barrier layer 150, and then etch the first insulating layer 101 covered by the etching barrier layer 150. For the first insulating layer 101 that is not covered by the etching barrier layer 150, the etching gas may directly etch the first insulating layer 101. Since the etching rate of the etching gas to the etching barrier layer 150 is lower than the etching rate of the etching gas to the first insulating layer 101, during the same etching time, the etching depth of the first insulating layer 101 covered by the etching barrier layer 150 is less than the etching depth of the first insulating layer 101 that is not covered by the etching barrier layer 150. In this way, a first opening 1012 is formed in the first insulating layer 101, and the size of the first opening 1012 is smaller than the size of the second opening 1032, that is, a step structure 300 is formed in the bending area 140, as shown in FIG. 10C.

For example, the gate electrode material may be molybdenum, that is, the etching barrier layer 150 is formed of molybdenum. The first insulating layer 101 may be formed of silicon nitride. A ratio of the etching rate of the etching gas containing "$SF_6$ and $O_2$" to molybdenum to the etching rate of the etching gas containing "$SF_6$ and $O_2$" to silicon nitride may be 5:8, that is to say, when the etching gas containing "$SF_6$ and $O_2$" etches the first insulating layer 101 with the thickness of 3200 Å, during the same etching time, the etching gas containing "$SF_6$ and $O_2$" may only etch the etching barrier layer 150 with the thickness of 2000 Å. For example, in some exemplary embodiments, the overall thickness of the first insulating layer 101 may be 4000 Å, and the thickness of the etching barrier layer 150 may be 2500 Å. In this way, when the etching gas containing "$SF_6$ and $O_2$" etches the first insulating layer 101 with the thickness of 4000 Å that is not covered by the etching barrier layer 150, during the same etching time, the etching barrier layer 150 with the thickness of 2500 Å is just completely etched, and a part of the first insulating layer 101 covered by the etching barrier layer 150 is retained. For another example, in some exemplary embodiments, the overall thickness of the first insulating layer 101 may be 4000 Å, and the thickness of the etching barrier layer 150 may be 2000 Å. In this way, when the etching gas containing "$SF_6$ and $O_2$" etches the first insulating layer 101 with the thickness of 4000 Å that is not covered by the etching barrier layer 150, during the same etching time, the etching barrier layer 150 with the thickness of 2000 Å are completely etched away, and a part of the first insulating layer 101 with the thickness of 800 Å in the first insulating layer 101 covered by the etching barrier layer 150 is etched. Therefore, in the first insulating layer 101 covered by the etching barrier layer 150, a part of the first insulating layer 101 with the thickness of 3200 Å is retained.

Figure 10D:
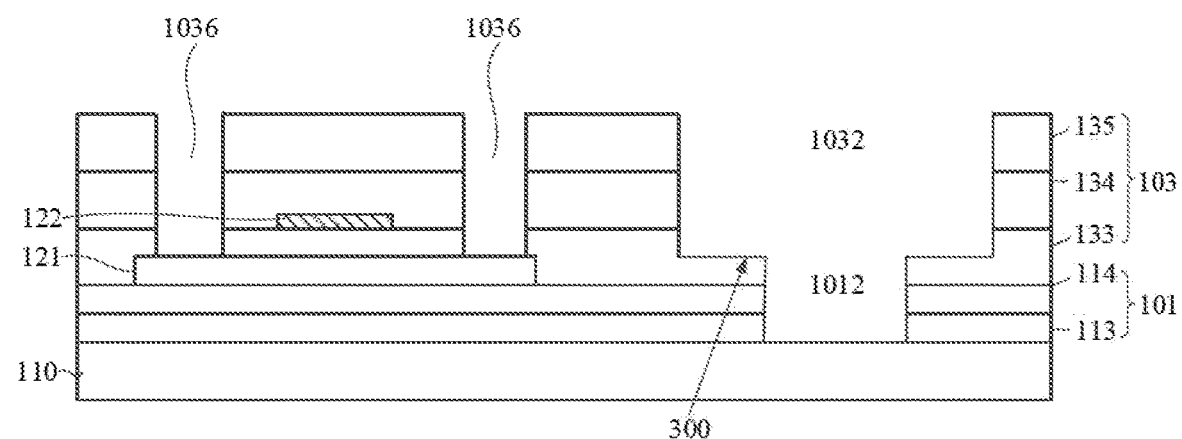

As shown in FIG. 10D, step S605 further includes peeling off the photoresist pattern 1052.

Therefore, in the embodiments of the present disclosure, by providing the etching barrier layer 150, the step structure 300 may be formed in the bending area 140 through one patterning process, thereby reducing the two patterning processes into one patterning process, and reducing the number of the mask. In this way, the manufacturing process of the flexible display substrate may be simplified and manufacturing costs may be saved.

In addition, in step S605, as shown in FIG. 7D, a plurality of via holes 1036 may be formed in the insulating layers in the display area AA through the same patterning process. That is, the plurality of via holes 1036, the first opening 1012, and the second opening 1032 may be formed by the same one patterning process.

Figure 7E:
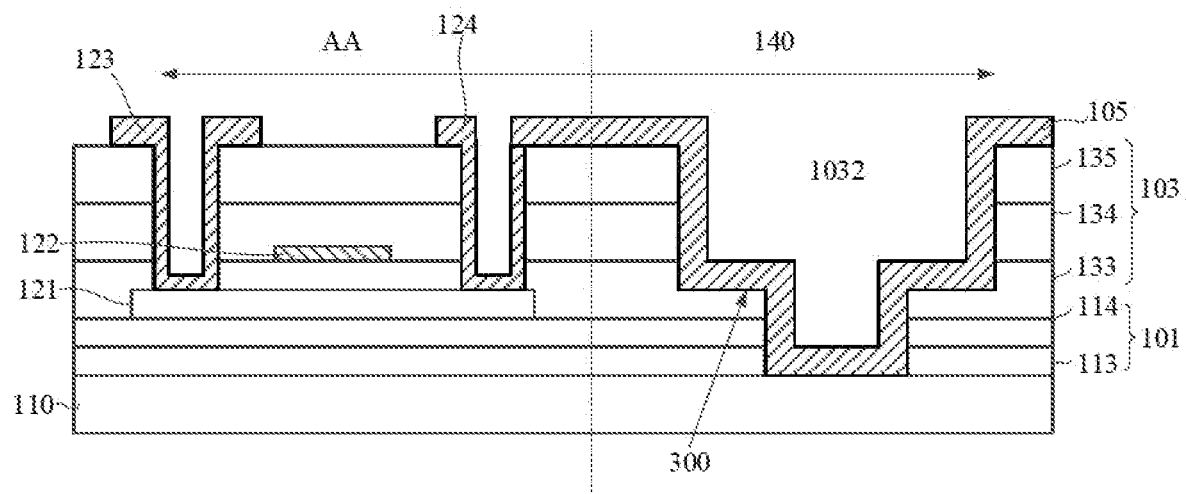

Further, in step S606, as shown in FIG. 7E, the source electrode 123 and the drain electrode 124 are formed in the display area AA, and the wiring 105 is formed in the bending area 140.

For example, a conductive material layer may be formed in both the display area AA and the bending area 140 through processes such as sputtering, physical vapor deposition, chemical vapor deposition, etc., for example, the conductive material layer may include gold (Au), silver (Ag), copper (Cu), aluminum (Al), molybdenum (Mo), magnesium (Mg), tungsten (W), and alloy materials formed by combining the above metals, or conductive metal oxide materials, such as indium tin oxide (ITO), indium zinc oxide (IZO), zinc oxide (ZnO), zinc aluminum oxide (AZO), etc. It may be understood that in the display area AA, the conductive material layer may be deposited in a plurality of via holes, and in the bending area 140, the conductive material layer may be deposited on the step structure 300.

For another example, a patterning process may be performed on the conductive material layer to form a patterned conductive material layer. The patterned conductive material layer includes the source electrode 123, the drain electrode 124, and the wiring 105. The patterning process may use a conventional photolithography process, including steps of photoresist coating, exposure, development, etching, and photoresist stripping, which will not be repeated here.

In this way, the source electrode 123 may be electrically connected to a source region of the active layer through the conductive material formed in the via holes, and the drain electrode 124 may be electrically connected to a drain region of the active layer through the conductive material formed in the via holes. The wiring 105 may electrically connect the drain electrode 124 to the pad area 130. Since the wiring 105 is formed on the step structure 300 in the bending area 140, the wiring 105 may be prevented from breaking when it is bent.

Figure 11:
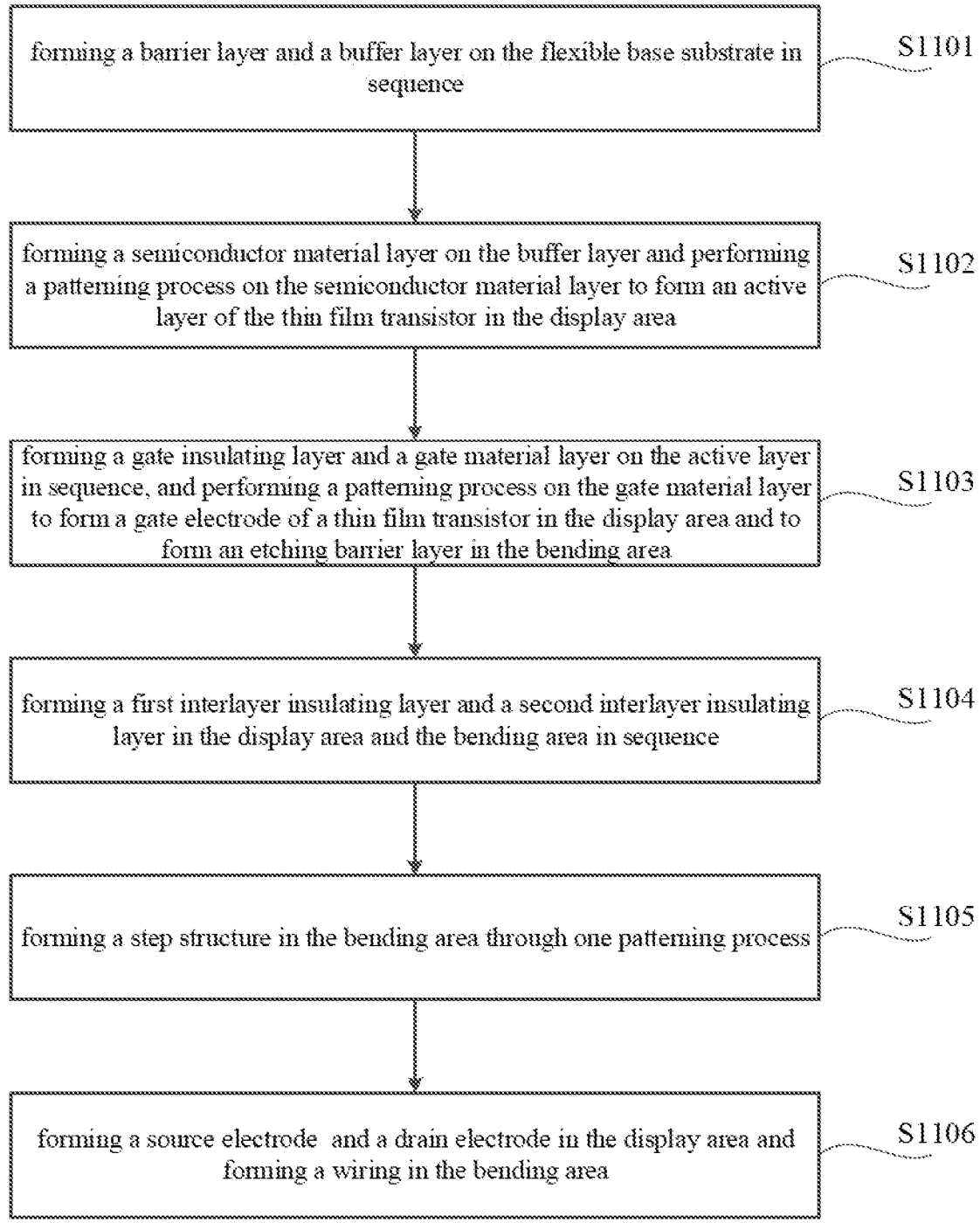
FIG. 11 is a flowchart of a method for manufacturing a flexible display substrate according to some embodiments of the present disclosure.

FIG. 11 is a flowchart of a method for manufacturing a flexible display substrate according to some embodiments of the present disclosure, and FIGS. 12A-12E schematically illustrate schematic diagrams of steps of a method for manufacturing a flexible display substrate according to some embodiments of the present disclosure. Referring to FIG. 11 and FIGS. 12A-12E together, the manufacturing method may include the following steps S1101-S1106.

Figure 12A:
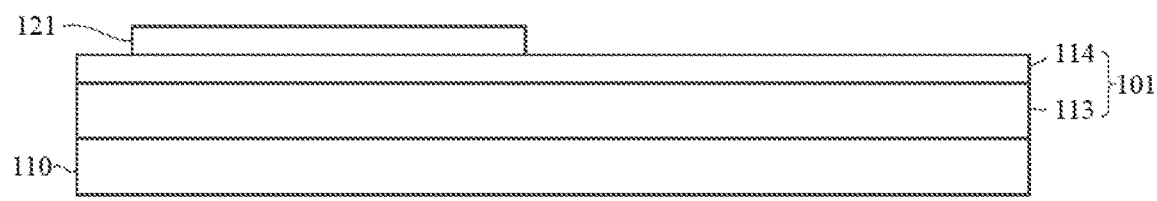
FIGS. 12A-12E schematically show schematic diagrams of steps of a method for manufacturing a flexible display substrate according to some embodiments of the present disclosure.

In step S1101, as shown in FIG. 12A, a barrier layer 113 and a buffer layer 114 may be sequentially formed on the flexible base substrate 110.

For example, the flexible base substrate 110 may be an organic flexible base substrate, for example, including polyimide (PI), polyethylene terephthalate (PET), polycarbonate, polyethylene, polyacrylate, polyetherimide, polyethersulfone, etc.

For example, the barrier layer 113 and the buffer layer 114 may include an inorganic insulating material, for example, silicon oxide, silicon nitride, silicon oxynitride, etc., or an insulating material including metallic elements such as aluminum oxide, titanium nitride and so on.

For example, the barrier layer 113 and the buffer layer 114 may be formed by a process such as chemical vapor deposition process and so on.

It should be noted that the first insulating layer 101 may include the barrier layer 113 and the buffer layer 114. However, the embodiments of the present disclosure are not limited thereto. In other embodiments, the first insulating layer 101 may also include other insulating layers.

In step S1102, as shown in FIG. 12A, a semiconductor material layer is formed on the buffer layer 114, and a patterning process is performed on the semiconductor material layer to form an active layer 121 of the thin film transistor in the display area.

For example, the semiconductor material layer may include a elementary substance semiconductor material or a compound semiconductor material, for example, may include amorphous silicon, polysilicon (low temperature polysilicon or high temperature polysilicon), metal oxide semiconductor (such as IGZO, AZO), and the like.

For example, the patterning process may use a conventional photolithography process, including steps of photoresist coating, exposure, development, etching, and photoresist stripping, which will not be repeated here.

Figure 12B:
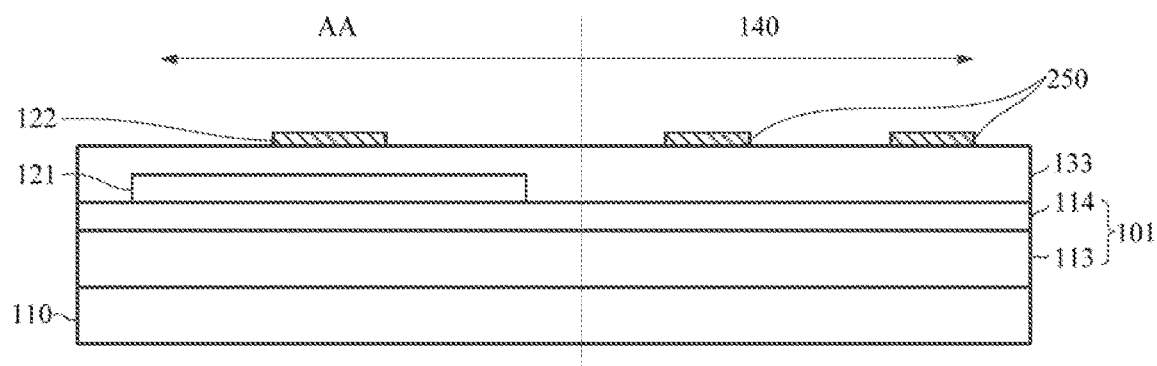
Figure 12C:
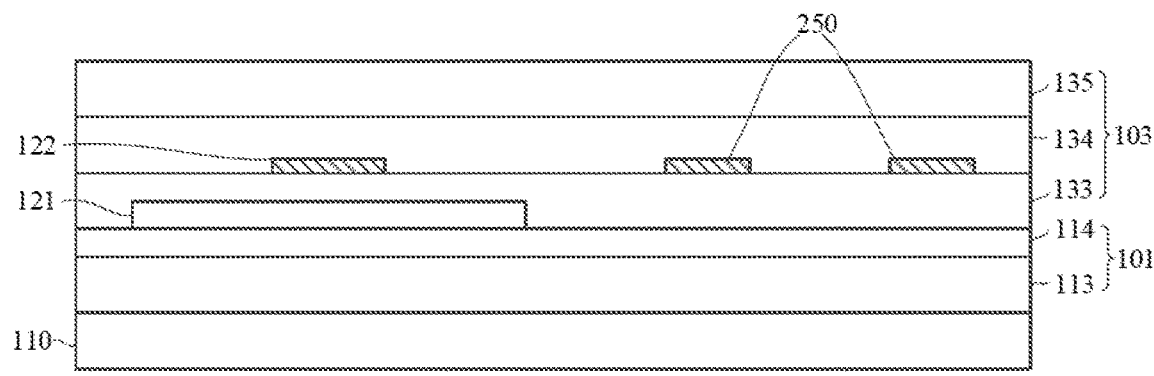

In step S1103, as shown in FIG. 12B, a gate insulating layer 133 and a gate electrode material layer may be sequentially formed on the active layer 121, and a patterning process may be performed on the gate electrode material layer to form a gate electrode 122 of the thin film transistor in the display area AA and to form an etching barrier layer 250 in the bending area 140.

For example, the gate insulating layer 133 may be have a single-layer structure of silicon nitride or silicon oxide or a multilayer structure formed by stacking silicon nitride and silicon oxide.

For example, the gate electrode material layer may include gold (Au), silver (Ag), copper (Cu), aluminum (Al), molybdenum (Mo), magnesium (Mg), tungsten (W) and alloy materials formed by combining the above metals, or conductive metal oxide materials, such as indium tin oxide (ITO), indium zinc oxide (IZO), zinc oxide (ZnO), zinc aluminum oxide (AZO), etc.

Figure 13:
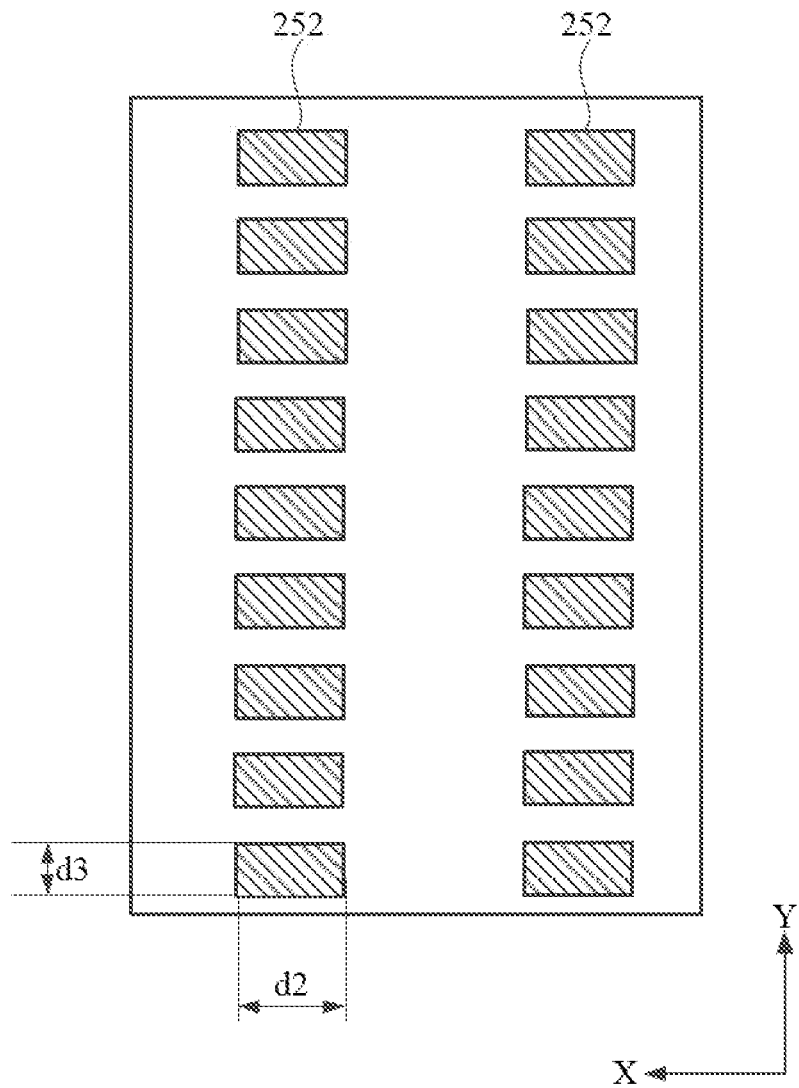
FIG. 13 shows a schematic plan view of an etching barrier layer in a bending area of a flexible display substrate according to some exemplary embodiments of the present disclosure.

FIG. 13 shows a schematic plan view of a bending area having an etching barrier layer. As shown in FIG. 13, the etching barrier layer 250 includes a plurality of island-shaped etching barrier portions 252. The plurality of island-shaped etching barrier portions 252 and the gate electrode 122 of the thin film transistor are formed of the same material and through the same patterning process. In other words, the material of the plurality of island-shaped etching barrier portions 252 may also include gold (Au), silver (Ag), copper (Cu), aluminum (Al), molybdenum (Mo), magnesium (Mg), tungsten (W) and alloy materials formed by combining the above metals, or conductive metal oxide materials, such as indium tin oxide (ITO), indium zinc oxide (IZO), zinc oxide (ZnO), zinc aluminum oxide (AZO), etc.

Referring to FIGS. 4, 12B and 13 in combination, the etching barrier layer 250 is formed at the position, where the step portion is to be formed, in the bending area 140. For example, the width (i.e., the width d2 in FIG. 13) of each island-shaped etching barrier portion 252 is substantially equal to the width (i.e., the width d in FIG. 4) of the step portion to be formed. Here, an expression "substantially equal" includes a difference between the width of each island-shaped etching barrier portion 252 and the width of the step portion to be formed is less than or equal to ±5 μm, that is, when the difference between the width of each island-shaped etching barrier portion 252 and the width of the step portion to be formed is less than or equal to ±5 μm, it may be considered that they are substantially equal to each other. Similarly, the width d2 of each island-shaped etching barrier portion 252 may be in the range of 10 μm-20 μm, and optionally, the width d2 of each island-shaped etching barrier portion 252 may be equal to 15 μm.

Specifically, step S1103 may be further described with reference to FIGS. 14A-14D.

Figure 14A:
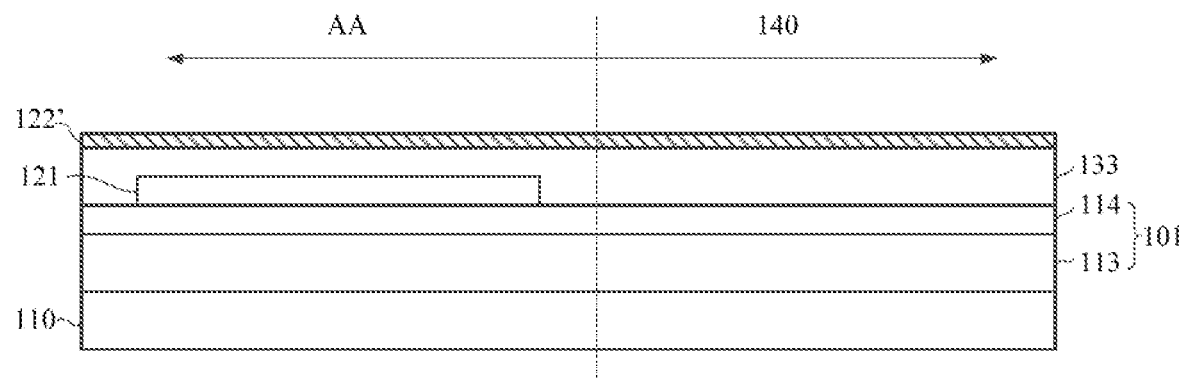
FIGS. 14A-14D schematically show schematic diagrams of steps of forming an etching barrier layer in a method for manufacturing a flexible display substrate according to some embodiments of the present disclosure.

As shown in FIG. 14A, for example, the gate insulating layer 133 may be formed in both the display area AA and the bending area 140 by chemical vapor deposition, and the gate electrode material layer 122' is formed on the gate insulating layer 133 in both the display area AA and the bending area 140 by processes such as sputtering, physical vapor deposition, and chemical vapor deposition and so on.

Figure 14B:
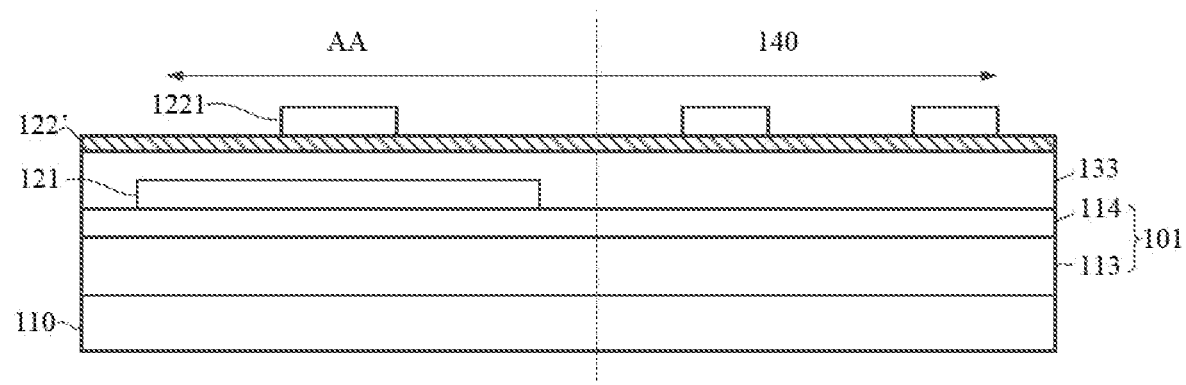

As shown in FIG. 14B, a photoresist may be coated on the gate electrode material layer 122', and the photoresist may be exposed and developed to form a photoresist pattern 1221. The photoresist pattern 1221 corresponds to positions of the gate electrode 122 and the etching barrier layer 250 to be formed, that is, an orthographic projection of the photoresist pattern 1221 on the flexible base substrate 110 covers orthographic projections of the gate electrode 122 and the etching the barrier layer 250 to be formed on the flexible base substrate 110.

Figure 14C:
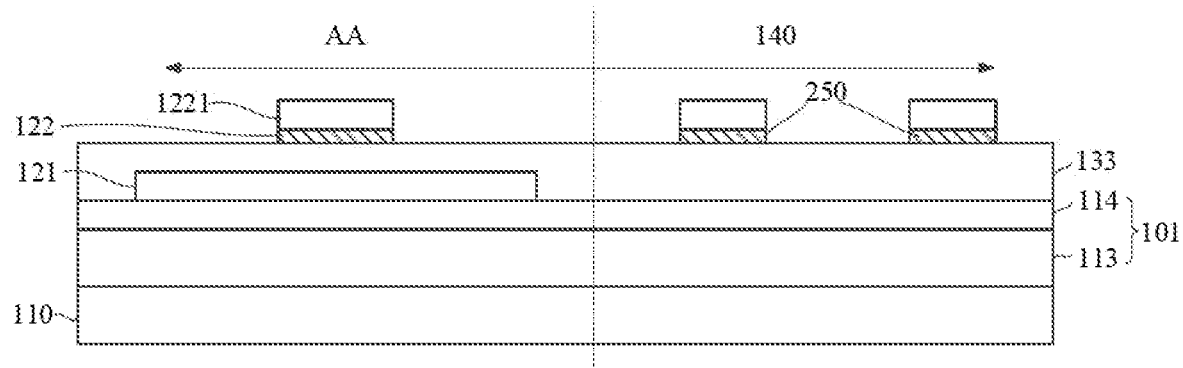

As shown in FIG. 14C, for example, a part of the gate electrode material layer 122' that is not covered by the photoresist pattern 1221 may be etched by a wet etching process to form the gate electrode 122 and the etching barrier layer 250.

Figure 14D:
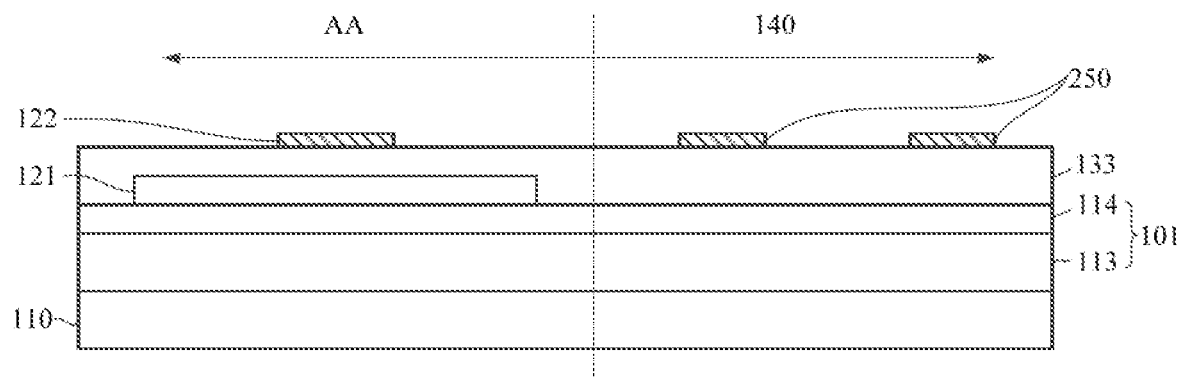

As shown in FIG. 14D, the photoresist pattern 1221 is peeled off. In this way, the gate electrode 122 of the thin film transistor is formed in the display area AA, and the etching barrier layer 250 is formed in the bending area 140.

It should be noted that in step S1103, in addition to forming the gate electrode 122 and the etching barrier layer 250, gate lines 142 of the flexible display substrate may also be formed through the same one patterning process, which will not be repeated here.

In step S1104, referring back to FIG. 12C, a first interlayer insulating layer 134 and a second interlayer insulating layer 135 are sequentially formed in both the display area AA and the bending area 140.

For example, the first interlayer insulating layer 134 and the second interlayer insulating layer 135 may include an inorganic insulating material, for example, silicon oxide, silicon nitride, silicon oxynitride, etc., or an insulating material including metallic elements such as aluminum oxide, titanium nitride and so on.

For example, the first interlayer insulating layer 134 and the second interlayer insulating layer 135 may be formed by using a chemical vapor deposition process or the like.

It should be noted that the second insulating layer 103 may include a gate insulating layer 133, a first interlayer insulating layer 134, and a second interlayer insulating layer 135. However, the embodiments of the present disclosure are not limited thereto, and in other embodiments, the second insulating layer 103 may also include other insulating layers.

Figure 12D:
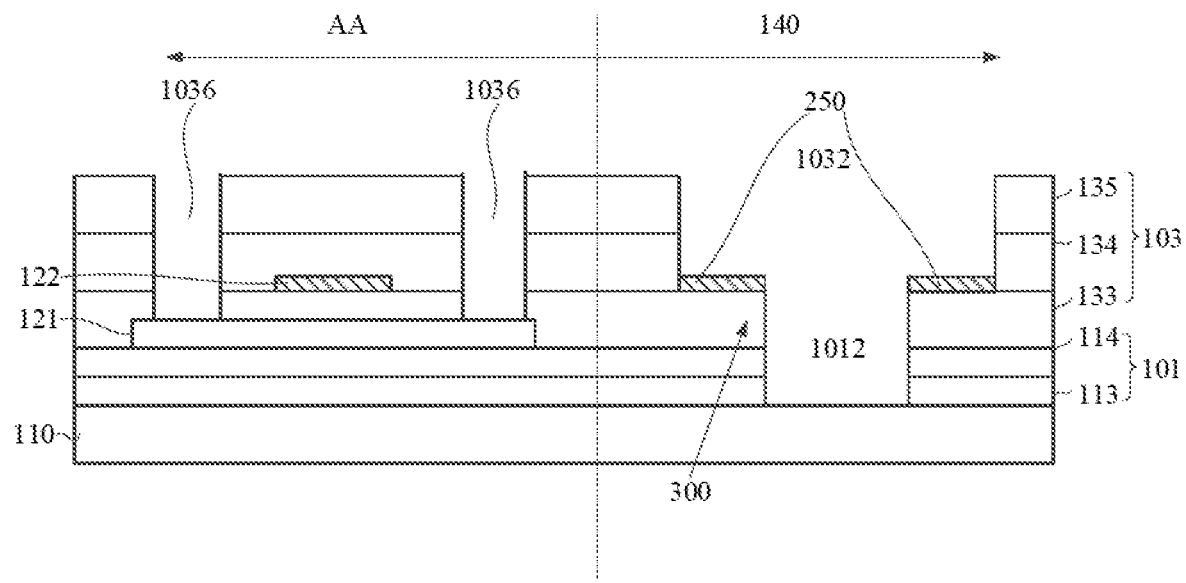

In step S1105, as shown in FIG. 12D, a step structure 300 is formed in the bending area 140 through one patterning process. For example, through one patterning process, the first opening 1012 is formed in the first insulating layer 101 (for example, including the barrier layer 113 and the buffer layer 114) and the second opening 1032 is formed in the second insulating layer 103 (for example, including the gate insulating layer 133, the first interlayer insulating layer 134 and the second interlayer insulating layer 135).

Specifically, the step S1105 may be further described with reference to FIGS. 15A-15D.

Figure 15A:
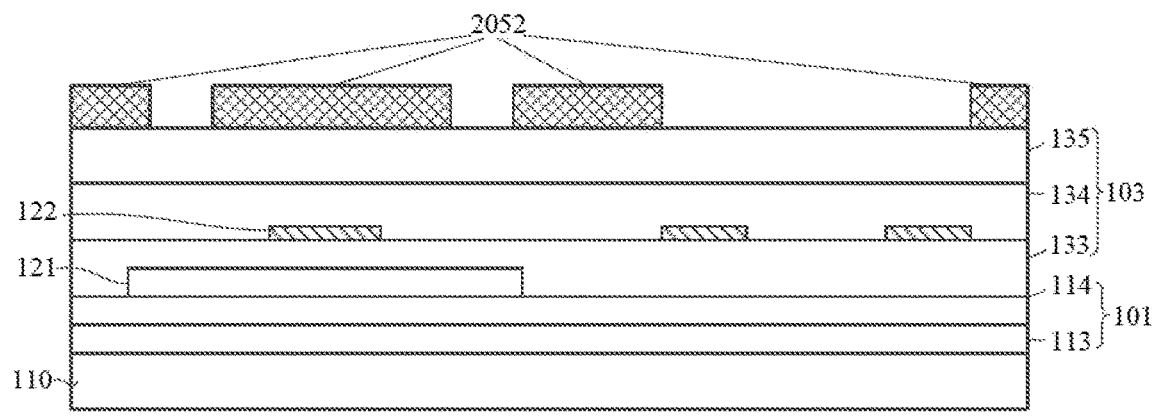
FIGS. 15A-15D schematically show schematic diagrams of steps of forming a step structure in a method for manufacturing a flexible display substrate according to some embodiments of the present disclosure.

As shown in FIG. 15A, a photoresist may be coated on the second interlayer insulating layer 135, and the photoresist may be exposed and developed to form a photoresist pattern 2052. For example, the photoresist pattern 2052 may expose the insulating layer located in the bending area 140.

Figure 15B:
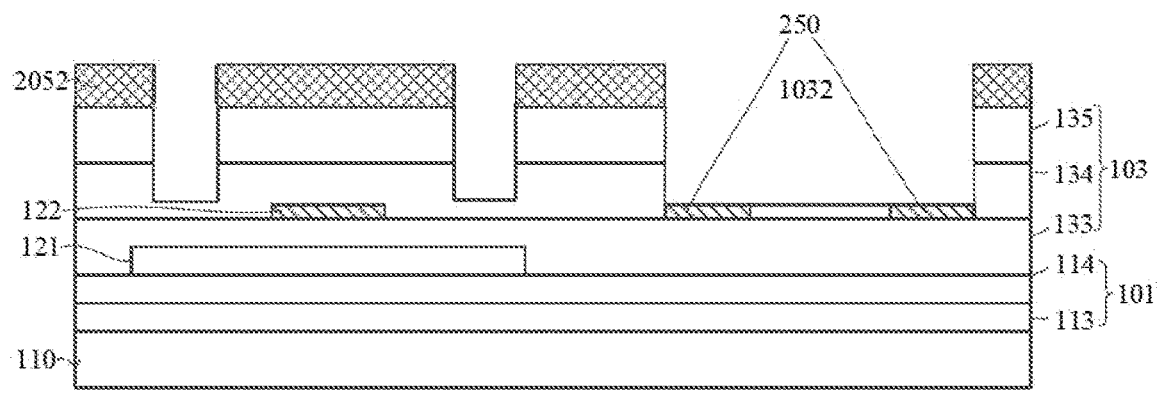
Figure 15C:
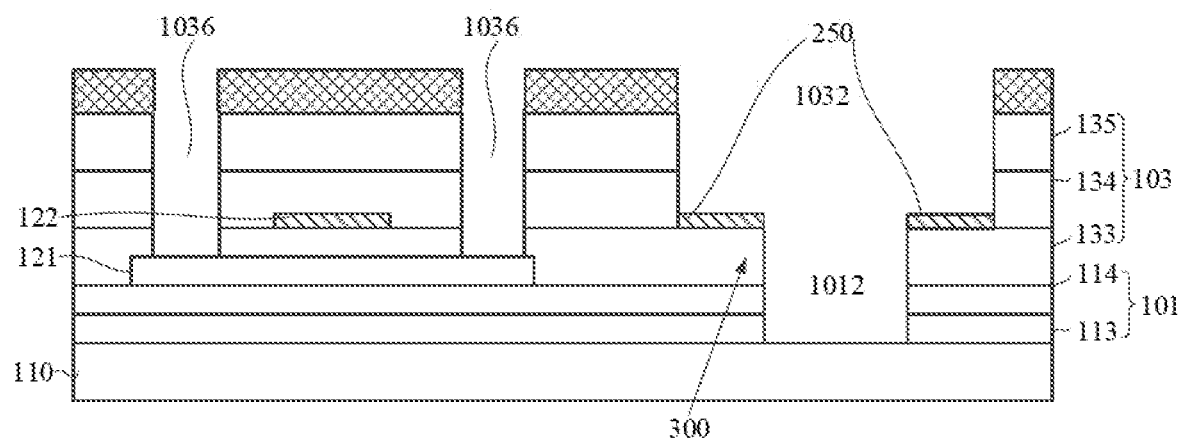

As shown in FIGS. 15B and 15C, the insulating layers that are not covered by the photoresist pattern 2052 may be etched by a dry etching process. For example, the first insulating layer 101 and the second insulating layer 103 may be etched by using a plasma etching gas containing "$CF_4$ and $O_2$". The etching barrier layer 250 is formed in the bending area 140, and the etching barrier layer 250 is formed of a metal material such as molybdenum or the like. For example, the etching gas containing "$CF_4$ and $O_2$" does not substantially etch the etching barrier layer 250, in other words, the etching barrier layer 250 acts as an etch barrier against an etching gas such as "$CF_4$ and $O_2$". In this embodiment, the etching rate of the etching gas to the etching barrier layer 250 is substantially equal to zero, which is less than the etching rate of the etching gas to the first insulating layer 101. Therefore, in the process of etching the first insulating layer 101 and the second insulating layer 103, the etching gas may first etch the second insulating layer 103 to form a second opening 1032 in the second insulating layer 103, as shown in FIG. 15B. Then, the etching gas further etches the first insulating layer 101 downward. Apart of the first insulating layer 101 that is covered by the etching barrier layer 250 may not be etched. A part of the first insulating layer 101 that is not covered by the etching barrier layer 250 may be directly etched by the etching gas. In this way, the first opening 1012 is formed in the first insulating layer 101, and the size of the first opening 1012 is smaller than the size of the second opening 1032, that is, a step structure 300 is formed in the bending area 140, as shown in FIG. 15C.

Therefore, in the embodiments of the present disclosure, by providing the etching barrier layer 250, the step structure 300 may be formed in the bending area 140 through one patterning process, thereby reducing two patterning processes into one patterning process, and reducing the number of the mask. In this way, the manufacturing process of the flexible display substrate may be simplified and manufacturing costs may be saved.

Figure 15D:
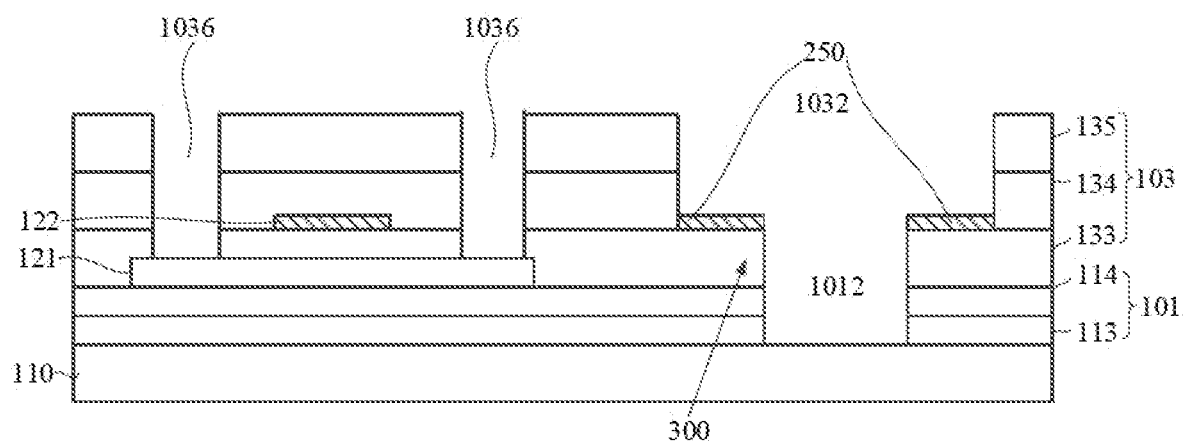

As shown in FIG. 15D, the step S1105 further includes peeling off the photoresist pattern 2052.

In addition, in the step S1105, as shown in FIG. 12D, a plurality of via holes 1036 may be formed in the insulating layer of the display area AA through the same patterning process. That is, the plurality of via holes 1036, the first opening 1012, and the second opening 1032 may be formed by the same one patterning process.

Figure 12E:
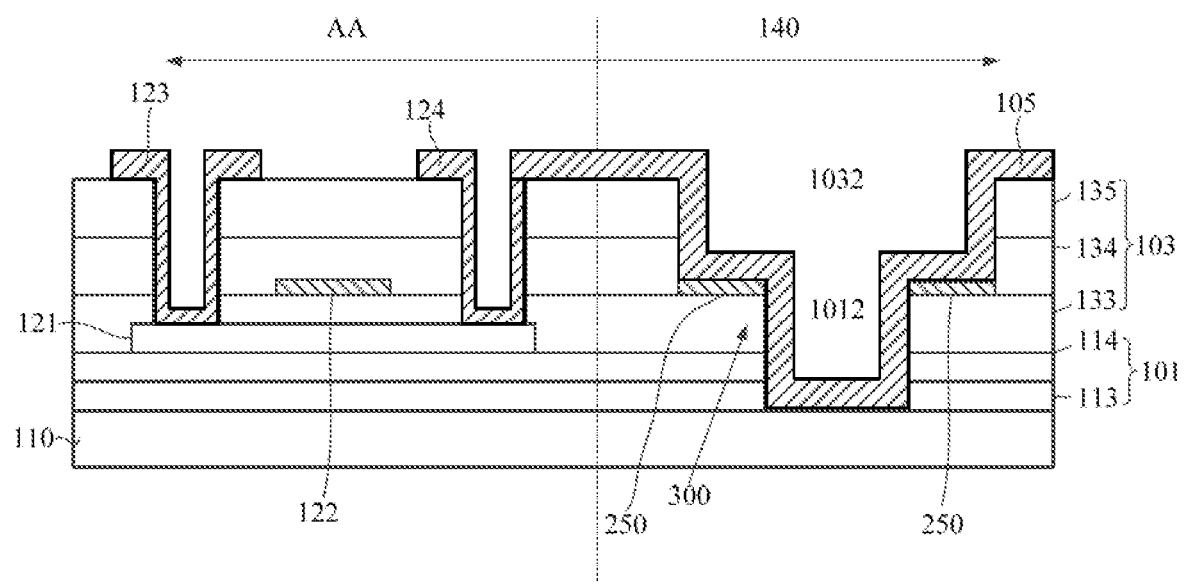

Further, in step S1106, as shown in FIG. 12E, the source electrode 123 and the drain electrode 124 are formed in the display area AA, and the wiring 105 is formed in the bending area 140.

For example, a conductive material layer may be formed in both the display area AA and the bending area 140 through processes such as sputtering, physical vapor deposition, chemical vapor deposition, etc., for example, the conductive material layer may include gold (Au) and silver (Ag), copper (Cu), aluminum (Al), molybdenum (Mo), magnesium (Mg), tungsten (W), and alloy materials formed by combining the above metals, or conductive metal oxide materials, such as indium tin oxide (ITO), indium zinc oxide (IZO), zinc oxide (ZnO), zinc aluminum oxide (AZO), etc. It may be understood that in the display area AA, the conductive material layer may be deposited in a plurality of via holes, and in the bending area 140, the conductive material layer may be deposited on the step structure 300.

For another example, a patterning process may be performed on the conductive material layer to form a patterned conductive material layer. The patterned conductive material layer includes the source electrode 123, the drain electrode 124, and the wiring 105. The patterning process may use a conventional photolithography process, including the steps of photoresist coating, exposure, development, etching, and photoresist stripping, which will not be repeated here.

In this way, the source electrode 123 may be electrically connected to a source region of the active layer through the conductive material formed in the via holes, and the drain electrode 124 may be electrically connected to a drain region of the active layer through the conductive material formed in the via holes. The wiring 105 may electrically connect the drain electrode 124 to the pad area 130. Since the wiring 105 is formed on the step structure 300 in the bending area 140, the wiring 105 may be prevented from breaking when it is bent.

Figure 16:
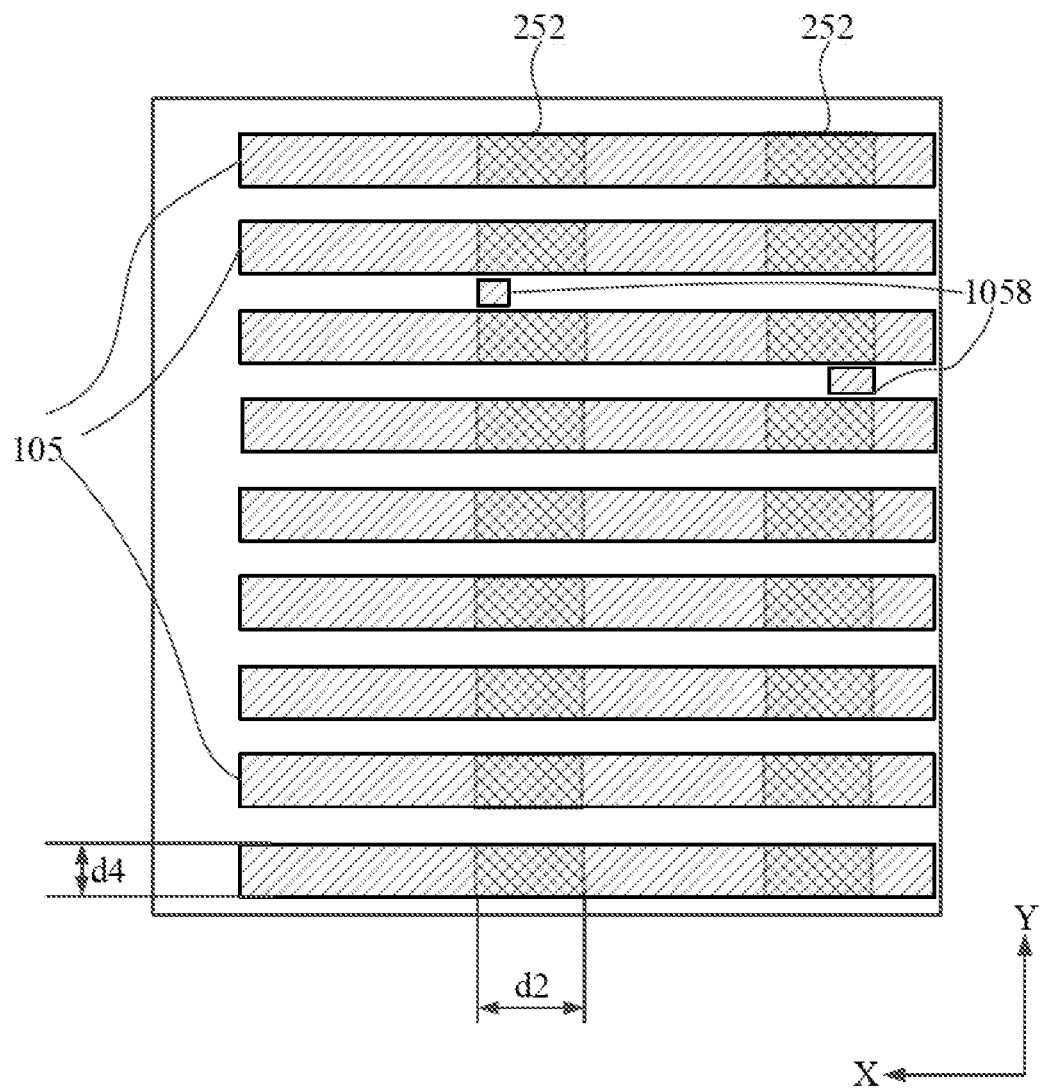
FIG. 16 shows a schematic plan view of a display area and a bending area of a flexible display substrate according to some exemplary embodiments of the present disclosure.

In addition, the inventors have found through many experiments that in the process of performing the patterning process on the above-mentioned conductive material layer to form the source electrode 123, the drain electrode 124, and the wiring 105, a residual conductive material may be easily remained at corners of the step structure 300, as shown in FIG. 16, a conductive material residual portion 1058 is shown. Referring to FIGS. 12E and 16 in combination, since the island-shaped etching barrier portions 252 are formed at the step portion 302 and the wiring 105 is formed on the etching barrier portion 252, the conductive material residual portion 1058 and the wiring 105 are located at different heights. That is, there is a segment difference between the conductive material residual portion 1058 and the wiring 105, and the segment difference prevents the conductive material residual portion 1058 from electrically connecting two wirings 105 which are adjacent to the conductive material residual portion 1058. In other words, even if there is residual conductive material, it may be ensured that adjacent wirings 105 will not be electrically connected to each other, thereby avoiding the problem of forming dark lines.

In another aspect, exemplary embodiments of the present disclosure also provide a flexible display substrate. As shown in FIG. 12E, the flexible display substrate may include: a flexible base substrate 110; a first insulating layer 101 disposed on the flexible base substrate 110, the first insulating layer 101 having a first opening 1012; an etching barrier layer 250 disposed on a side of the first insulating layer 101 away from the flexible base substrate; and a second insulating layer 103 disposed on a side of the first insulating layer 101 away from the flexible base substrate, the second insulating layer 103 having a second opening 1032. The orthographic projection of the first opening 1012 on the flexible base substrate 110 falls within the orthographic projection of the second opening 1032 on the flexible base substrate 101. The flexible display substrate may further include the step portion 302 located at a connecting position where the first opening 1012 is connected to the second opening 1032, and the etching barrier layer 250 is located on the step portion 302.

As shown in FIG. 13, the etching barrier layer 250 may include a plurality of island-shaped etching barrier portions 252 which are spaced apart from each other. For example, as shown in FIG. 13 and FIG. 16, each island-shaped etching barrier portion 252 has a first size in a direction that is parallel to a surface of the flexible base substrate 110 and perpendicular to an extension direction of the wiring 105, that is, size d3 in the Y direction in FIG. 13. Each wiring 105 has a second size in a direction that is parallel to the surface of the flexible base substrate 110 and perpendicular to the extension direction of the wiring 105, that is, size d4 in the Y direction in FIG. 16. The first size d3 is equal to the second size d4. For example, the size d4 of each wiring 105 may be about 5 μm, and the first size d3 of each island-shaped etching barrier portion 252 may also be about 5 μm. It should be noted that, in the embodiments of the present disclosure, the first size d3 may be substantially equal to the second size d4, and the expression "substantially equal" here means that the first size d3 and the second size d4 may be equal, or the difference between the first size d3 and the second size d4 may be within +5% of the first size d3 or the second size d4.

In addition, as shown in FIG. 13, each island-shaped etching barrier portion 252 has a third size in a direction that is parallel to the surface of the flexible base substrate 110 and parallel to the extension direction of the wiring 105, that is, size d2 in the X direction in FIG. 13. The third size d2 is substantially equal to the width of the step portion 302 of the step structure 300.

Referring back to FIG. 12E, the flexible display substrate may further include a thin film transistor located in the display area AA. The thin film transistor may include an active layer 121, a gate electrode 122, a source electrode 123 and a drain electrode 124. The gate electrode 122 and the etching barrier layer 250 may be located in the same layer, that is, the gate electrode 122 and the etching barrier layer 250 may be formed of the same material and through the same one patterning process.

The flexible display substrate may further include a wiring 105 located on the sidewall of the second opening 1032, the step portion 302, and the sidewall and bottom surface of the first opening 1012. The wiring 105 may electrically connect the drain electrode 124 to the pad area 130.

The flexible display substrate according to the above-mentioned embodiments may be manufactured according to the above-mentioned manufacturing method, so it may have all the characteristics and advantages of the manufacturing method described in the above-mentioned embodiments, which will not be repeated here.

Although some embodiments of the general inventive concept of the present disclosure have been shown and described, those of ordinary skill in the art will understand that changes may be made to these embodiments without departing from the principle and spirit of the general inventive concept of the present disclosure, thus the scope of this disclosure shall be defined by the claims and their equivalents.

What is claimed is:

1. A method for manufacturing a flexible display substrate, comprising:
    forming a first insulating layer on a flexible base substrate, the first insulating layer at least covering a bending area of the flexible display substrate;
    forming an etching barrier layer on a side of the first insulating layer away from the flexible base substrate, the etching barrier layer being located in the bending area;
    forming a second insulating layer covering the etching barrier layer on the side of the first insulating layer away from the flexible base substrate; and
    forming a first opening in the first insulating layer and a second opening in the second insulating layer through one patterning process, so that the first opening and the second opening are both located in the bending area, and an orthographic projection of the first opening on the flexible base substrate falls within an orthographic projection of the second opening on the flexible base substrate, so as to form a step portion at a connection position where the first opening is connected to the second opening.

2. The method according to claim 1, wherein forming the first opening in the first insulating layer and the second opening in the second insulating layer through one patterning process comprises:
    etching the second insulating layer by using an etching gas to form the second opening in the second insulating layer, so that the second opening exposes the etching barrier layer and a part of the first insulating layer; and
    etching the etching barrier layer and the part of the first insulating layer exposed by the second opening by using the etching gas to form the first opening in the first insulating layer,
    wherein an etching rate of the etching gas to the etching barrier layer is lower than an etching rate of the etching gas to the first insulating layer.

3. The method according to claim 2, wherein the etching rate of the etching gas to the etching barrier layer is substantially zero.

4. The method according to claim 3, wherein etching the etching barrier layer and the part of the first insulating layer exposed by the second opening by using the etching gas to form the first opening in the first insulating layer specifically comprises:
    etching the part of the first insulating layer, that is exposed by the second opening and not covered by the etching barrier layer, by using the etching gas; and
    keeping the etching barrier layer and a part of the first insulating layer covered by the etching barrier layer.

5. The method according to claim 3, wherein forming the etching barrier layer on the side of the first insulating layer away from the flexible base substrate specifically comprises:
    forming a plurality of island-shaped etching barrier portions, which are spaced apart from one another, on the side of the first insulating layer away from the flexible base substrate.

6. The method according to claim 3, wherein the etching gas comprises carbon tetrafluoride and oxygen.

7. The method according to claim 2, wherein etching the etching barrier layer and the part of the first insulating layer exposed by the second opening by using the etching gas to form the first opening in the first insulating layer specifically comprises:
    etching the part of the first insulating layer, that is exposed by the second opening and not covered by the etching barrier layer, by using the etching gas;
    etching the etching barrier layer by using the etching gas; and
    etching a part of the first insulating layer, that is covered by the etching barrier layer, by using the etching gas.

8. The method according to claim 2, wherein etching the etching barrier layer and the part of the first insulating layer exposed by the second opening by using the etching gas to form the first opening in the first insulating layer specifically comprises:
    etching the part of the first insulating layer, that is exposed by the second opening and not covered by the etching barrier layer, by using the etching gas;
    etching the etching barrier layer by using the etching gas; and
    keeping a part of the first insulating layer covered by the etching barrier layer.

9. The method according to claim 2, wherein forming the etching barrier layer on the side of the first insulating layer away from the flexible base substrate specifically comprises:
    forming at least two etch barrier lines, which are spaced apart from one another, on the side of the first insulating layer away from the flexible base substrate.

10. The method according to claim 2, wherein the etching gas comprises sulfur hexafluoride and oxygen.

11. The method according to claim 1, wherein forming the etching barrier layer on the side of the first insulating layer away from the flexible base substrate specifically comprises:
    forming a gate electrode material layer on the side of the first insulating layer away from the flexible base substrate; and
    performing one patterning process on the gate electrode material layer to form a gate electrode of a thin film transistor and the etching barrier layer.

12. The method according to claim 1, further comprising: forming a conductive wiring in both the first opening and the second opening.

13. The method according to claim 12, wherein, a plurality of via holes are formed in both the first insulating layer and the second insulating layer while forming the first opening in the first insulating layer and the second opening in the second insulating layer through one patterning process.

14. The method according to claim 13, wherein forming the conductive wiring in both the first opening and the second opening specifically comprises:

depositing a conductive material layer on a surface of the second insulating layer away from the flexible base substrate, in the plurality of via holes, in the first opening and in the second opening, respectively; and forming a source electrode and a drain electrode of a thin film transistor as well as the conductive wiring through one patterning process.

15. The method according to claim 1, wherein the first insulating layer comprises a barrier layer and a buffer layer; and/or, the second insulating layer comprises a gate insulating layer, a first interlayer insulating layer and a second interlayer insulating layer.

16. A flexible display substrate, comprising:
a flexible base substrate;
a first insulating layer on the flexible base substrate, wherein the first insulating layer covers at least a bending area of the flexible display substrate, and the first insulating layer is provided with a first opening;
an etching barrier layer on a side of the first insulating layer away from the flexible base substrate; and
a second insulating layer on the side of the first insulating layer away from the flexible base substrate, wherein the second insulating layer is provided with a second opening,
wherein an orthographic projection of the first opening on the flexible base substrate falls within an orthographic projection of the second opening on the flexible base substrate, the flexible display substrate further comprises a step portion at a connection position where the first opening is connected to the second opening, the etching barrier layer is located at the step portion, and the first opening, the second opening and the step portion are all located in the bending area.

17. The flexible display substrate according to claim 16, wherein the etching barrier layer comprises a plurality of island-shaped etching barrier portions that are spaced apart from one another.

18. The flexible display substrate according to claim 17, further comprising a plurality of conductive wirings located on a sidewall of the second opening, on the step portion, and on a sidewall and a bottom surface of the first opening, and each of the conductive wirings extends from a display area of the flexible display substrate to a non-display area of the flexible display substrate.

19. The flexible display substrate according to claim 18, wherein each of the island-shaped etching barrier portions has a first size in a direction parallel to a surface of the flexible base substrate and perpendicular to an extension direction of the conductive wirings, each of the conductive wirings has a second size in the direction parallel to the surface of the flexible base substrate and perpendicular to the extension direction of the conductive wirings, and the first size is substantially equal to the second size.

20. The flexible display substrate according to claim 16, further comprising a thin film transistor on the flexible base substrate, the thin film transistor comprising a gate electrode, a source electrode and a drain electrode,
wherein the gate electrode and the etching barrier layer are located in the same layer.

* * * * *